United States Patent
Bae et al.

(10) Patent No.: US 12,132,109 B2
(45) Date of Patent: Oct. 29, 2024

(54) FERROELECTRIC SEMICONDUCTOR DEVICE AND METHOD OF EXTRACTING DEFECT DENSITY OF THE SAME

(71) Applicant: Samsung Electronics Co., Ltd., Suwon-si (KR)

(72) Inventors: Hagyoul Bae, Hanam-si (KR); Seunggeol Nam, Suwon-si (KR); Jinseong Heo, Seoul (KR); Sanghyun Jo, Seoul (KR); Dukhyun Choe, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 289 days.

(21) Appl. No.: 17/677,654

(22) Filed: Feb. 22, 2022

(65) Prior Publication Data
US 2023/0093076 A1 Mar. 23, 2023

(30) Foreign Application Priority Data
Sep. 17, 2021 (KR) .................. 10-2021-0125215

(51) Int. Cl.
*H01L 29/06* (2006.01)
*H01L 21/66* (2006.01)
(Continued)

(52) U.S. Cl.
CPC ........ *H01L 29/78391* (2014.09); *H01L 22/12* (2013.01); *H01L 29/516* (2013.01);
(Continued)

(58) Field of Classification Search
CPC . H01L 29/78391; H01L 22/12; H01L 29/516; H01L 29/6684; H01L 29/0665;
(Continued)

(56) References Cited

U.S. PATENT DOCUMENTS 6,107,656 A * 8/2000 Igarashi ................ H10B 51/00
257/295
6,707,082 B2 * 3/2004 Haneder ............... H01L 29/516
257/388

(Continued)

FOREIGN PATENT DOCUMENTS

JP 2001-196434 A 7/2001
JP 4316533 B2 8/2009
(Continued)

OTHER PUBLICATIONS

S. Dunkel, et al. "A FeFET based super-low-power ultra-fast embedded NVM technology for 22nm FDSOI and beyond," IEEE, IEDM17-485, pp. 19.7.1-19.7.4 (2017).
(Continued)

*Primary Examiner* — Sheikh Maruf
(74) *Attorney, Agent, or Firm* — Harness, Dickey & Pierce, P.L.C.

(57) ABSTRACT

Provided are a ferroelectric semiconductor device and a method of extracting a defect density of the same. A ferroelectric electronic device includes a first layer, an insulating layer including a ferroelectric layer and a first interface that is adjacent to the first layer, and an upper electrode over the insulating layer, wherein the insulating layer has a bulk defect density of $10^{16}$ cm$^{-3}$eV$^{-1}$ or more and an interface defect density of $10^{10}$ cm$^{-2}$eV$^{-1}$ or more.

17 Claims, 26 Drawing Sheets

(51) Int. Cl.
  *H01L 29/51* (2006.01)
  *H01L 29/66* (2006.01)
  *H01L 29/78* (2006.01)
  H01L 29/423 (2006.01)
  H01L 29/786 (2006.01)
(52) U.S. Cl.
  CPC ...... *H01L 29/6684* (2013.01); *H01L 29/0665* (2013.01); *H01L 29/42392* (2013.01); *H01L 29/7851* (2013.01); *H01L 29/78696* (2013.01)
(58) Field of Classification Search
  CPC ........... H01L 29/42392; H01L 29/7851; H01L 29/78696; H01L 29/511; H01L 29/66439; H01L 29/0673; H01L 29/785; H01L 29/40111; H01L 29/775; H01L 28/40; B82Y 10/00; H10B 53/30
  USPC ........................................................ 257/295
  See application file for complete search history.

(56) References Cited

U.S. PATENT DOCUMENTS

| | | | | |
|---|---|---|---|---|
| 6,876,030 | B2* | 4/2005 | Uchiyama | H01L 29/7881 257/314 |
| 7,285,811 | B2* | 10/2007 | Yates | H10B 61/00 438/257 |
| 7,709,402 | B2* | 5/2010 | Ahn | H01L 29/51 438/785 |
| 9,978,868 | B2 | 5/2018 | Lai et al. | |
| 2002/0043675 | A1* | 4/2002 | Lee | H10B 53/30 257/295 |
| 2005/0145907 | A1* | 7/2005 | Windlass | C23C 14/205 257/295 |
| 2006/0017120 | A1* | 1/2006 | Sakai | C23C 16/40 257/E21.208 |
| 2006/0131627 | A1* | 6/2006 | Kondo | H01L 21/02337 257/295 |
| 2007/0205448 | A1* | 9/2007 | Kalinin | H10N 70/026 257/295 |
| 2009/0224301 | A1* | 9/2009 | Yamakawa | H10B 53/00 257/295 |
| 2010/0144062 | A1* | 6/2010 | Matsui | H10B 53/30 257/E21.664 |
| 2015/0004718 | A1* | 1/2015 | Sun | H01L 21/76849 438/3 |
| 2015/0069481 | A1* | 3/2015 | Sun | H01L 28/56 257/295 |
| 2015/0072441 | A1* | 3/2015 | Sun | H10B 53/00 438/3 |
| 2015/0079698 | A1* | 3/2015 | Udayakumar | H10B 53/30 438/3 |
| 2016/0247932 | A1* | 8/2016 | Sakai | H01L 21/02197 |
| 2017/0141235 | A1 | 5/2017 | Lai et al. | |
| 2019/0057860 | A1* | 2/2019 | Yoon | H01L 21/28568 |
| 2019/0393355 | A1 | 12/2019 | Yoo et al. | |
| 2020/0035807 | A1* | 1/2020 | Chen | H01L 28/65 |
| 2020/0075609 | A1 | 3/2020 | Morris et al. | |
| 2020/0098925 | A1 | 3/2020 | Dewey et al. | |
| 2020/0105940 | A1 | 4/2020 | Majhi et al. | |
| 2021/0066469 | A1 | 3/2021 | Cao et al. | |
| 2021/0280720 | A1* | 9/2021 | Lee | H10B 51/40 |
| 2021/0384315 | A1* | 12/2021 | Chen | H01L 29/6684 |

FOREIGN PATENT DOCUMENTS

| | | |
|---|---|---|
| JP | 6389395 B2 | 9/2018 |
| KR | 10-2020-0010626 A | 1/2020 |

OTHER PUBLICATIONS

Nanbo Gong, et al. "A Study of Endurance Issues in HfO2-Based Ferroelectric Field Effects Transistors: Charge Trapping and Trap Generation," IEEE Electron Device Letters, vol. 39, No. 1, pp. 1-4 (2018).

Kai Ni, et al. "Critical Role of Interlayer in Hf0.5Zr0.5O2 Ferrelectric FET Nonvolatile Memory Performance," IEEE Transactions on Electron Devices, vol. 65, No. 6, pp. 2461-2469 (2018).

X. Lyu, et al. "First Direct Measurement of Sub-Nanosecond Polarization Switching in Ferrelectric Hafnium Zirconium Oxide," IEEE, IEDM19-342, pp. 15.2.1-15.2.4 (2019).

Qing Luo, et al. "Hybrid 1T e-DRAM and E-NVM Realized in One 10 nm node Ferro FinFET device with a Charge Trappping and Doman Switching Effects," IEDM18-47, pp. 2.6.1-2.6.4 (2018).

M. H. Lin et al. "Hafnium Zirconium Oxide with Optimized Gate Stack," ECS Journal of Sould State Science and Technology, vol. 7, No. 11, pp. P640-P646 (2018).

\* cited by examiner

FERROELECTRIC SEMICONDUCTOR DEVICE AND METHOD OF EXTRACTING DEFECT DENSITY OF THE SAME

CROSS-REFERENCE TO RELATED APPLICATION

This application is based on and claims priority under 35 U.S.C. § 119 to Korean Patent Application No. 10-2021-0125215, filed on Sep. 17, 2021, in the Korean Intellectual Property Office, the disclosure of which is incorporated by reference herein in its entirety.

BACKGROUND

Some example embodiments relate to a ferroelectric semiconductor device and a method of extracting a defect density of the same.

As a next-generation logic/memory semiconductor device technology, a lot of research is being conducted on fast operation characteristics of a ferroelectric electronic device. In a ferroelectric electronic device, a defect in a gate insulating layer and an interface of the gate insulating layer greatly affects device performance. A defect in a gate insulating layer and an interface of the gate insulating layer acts as an important parameter for implementing negative capacitance of a ferroelectric-based logic semiconductor device and securing a hysteresis curve of a memory semiconductor device.

However, in the case of considering only the number of defects in an entire gate insulating layer including a ferroelectric, accurately determining the influence of a ferroelectric layer and/or a paraelectric layer on device performance may be difficult.

SUMMARY

Provided are a ferroelectric electronic device capable of quantitatively monitoring and/or controlling a defect in an insulating layer or an interface thereof, and/or a method of extracting a defect density of the same, and/or a method of fabricating a ferroelectric device.

Additional aspects will be set forth in part in the description which follows and, in part, will be apparent from the description, and/or may be learned by practice of various example embodiments.

According to some example embodiments, a ferroelectric electronic device includes: a first layer; an insulating layer including a first interface and a ferroelectric layer, the first interface adjacent to the first layer; and an upper electrode over the insulating layer. The insulating layer has a bulk defect density per volume of $10^{16}$ cm$^{-3}$eV$^{-1}$ or more and an interface defect density per area of $10^{10}$ cm$^{-2}$eV$^{-1}$ or more.

The first interface may have the interface defect density of about $10^{10}$ cm$^{-2}$eV$^{-1}$ to about $10^{13}$ cm$^{-2}$eV$^{-1}$, and the ferroelectric layer may have the bulk defect density of about $10^{17}$ cm$^{-3}$eV$^{-1}$ to about $10^{20}$ cm$^{-3}$eV$^{-1}$.

The insulating layer may further include a paraelectric layer forming or corresponding otto the first interface with the first layer between the first layer and the ferroelectric layer, a second interface between the paraelectric layer and the ferroelectric layer may have a second interface defect density per area of about $10^{11}$ cm$^{-2}$eV$^{-1}$ to about $10^{14}$ cm$^{-2}$eV$^{-1}$, and the paraelectric layer may have a second bulk defect density per volume of about $10^{17}$ cm$^{-3}$eV$^{-1}$ to about $10^{20}$ cm$^{-3}$eV$^{-1}$.

The paraelectric layer may include at least one of SiO, AlO, SiON, and SiN.

The ferroelectric layer may include an oxide including at least one of Hf and Zr.

The ferroelectric layer may include at least one type of dopant among Si, Al, Y, La, Gd, Sr, C, Ge, Sn, Pb, Mg, Ca, Ba, and Ti.

The first layer may include a channel, the insulating layer may be or correspond to a gate insulating layer, and the upper electrode may be or correspond to a gate electrode.

The ferroelectric electronic device may be or may include a memory device/memory cell having two or more threshold voltages.

The ferroelectric electronic device may have negative capacitance.

The channel may include any one of a gate-all-around channel, a nanosheet channel, and a fin channel.

The channel may include at least one of Si, Ge, an oxide semiconductor, a group III-V semiconductor, a two-dimensional (2D) material, quantum dots, and an organic material.

The first layer may include a lower electrode.

According to some example embodiments, there is a method of extracting a defect density of a ferroelectric electronic device, wherein the ferroelectric electronic device includes a first layer, an insulating layer including a ferroelectric layer and a first interface adjacent to the first layer, and an upper electrode over the insulating layer. The method includes: extracting a first defect density per volume in the insulating layer of the ferroelectric electronic device by low-frequency noise analysis; and extracting a second defect density per area in a region of the first interface by a current-voltage measurement method.

The insulating layer may further include a paraelectric layer forming or corresponding to the first interface with the first layer between the first layer and the ferroelectric layer, and the extracting of the first defect density by the low-frequency noise analysis may be performed on the paraelectric layer, a second interface between the paraelectric layer and the ferroelectric layer, and up to a certain area of the ferroelectric layer.

The extracting of the defect density by the low-frequency noise analysis may be performed at a distance of 0.5 nm or more from the first layer.

The extracting of the defect density by the low-frequency noise analysis may be performed at a distance of 1 nm or more from the first layer.

The extracting of the defect density by the low-frequency noise analysis may be performed at a distance of about 0.5 nm to about 1.4 nm from the first layer.

The first interface may have an interface defect density per area of about $10^{10}$ cm$^{-2}$eV$^{-1}$ to about $10^{13}$ cm$^{-2}$eV$^{-1}$, the ferroelectric layer may have a bulk defect density per volume of about $10^{17}$ cm$^{-3}$eV$^{-1}$ to about $10^{20}$ cm$^{-3}$eV$^{-1}$, and the first layer may include at least one of a channel or a lower electrode.

The insulating layer may further include a paraelectric layer forming or corresponding to the first interface with the first layer between the first layer and the ferroelectric layer, a second interface between the paraelectric layer and the ferroelectric layer may have an interface defect density per area of about $10^{11}$ cm$^{-2}$eV$^{-1}$ to about $10^{14}$ cm$^{-2}$eV$^{-1}$, and the paraelectric layer may have a bulk defect density per volume of about $10^{17}$ cm$^{-3}$eV$^{-1}$ to about $10^{20}$ cm$^{-3}$eV$^{-1}$.

According to some example embodiments, there is a method of fabricating a ferroelectric electronic device, wherein the ferroelectric electronic device includes a first layer, an insulating layer including a ferroelectric layer and a first interface adjacent to the first layer, the ferroelectric device further including an upper electrode over the insulating layer. The method includes extracting a first defect density per volume in the insulating layer of the ferroelectric electronic device by a low-frequency noise analysis, extracting a second defect density per area in a region of the first interface, and performing a process to fabricate the ferroelectric electronic device based on the first defect density and the second defect density.

The method may also include adjusting a process parameter of the process based on at least one of the first defect density and the second defect density.

The extracting of the first defect density by the low-frequency noise analysis may be performed at a distance of 0.5 nm or more from the first layer.

The first interface may have an interface defect density per area of about $10^{10}$ cm$^{-2}$eV$^{-1}$ to about $10^{13}$ cm$^{-2}$eV$^{-1}$, and the ferroelectric layer may have a bulk defect density per volume of about $10^{17}$ cm$^{-3}$eV$^{-1}$ to about $10^{20}$ cm$^{-3}$eV$^{-1}$.

BRIEF DESCRIPTION OF THE DRAWINGS

The above and other aspects, features, and/or advantages of certain example embodiments will be more apparent from the following description taken in conjunction with the accompanying drawings, in which.

DETAILED DESCRIPTION

Figure 1:
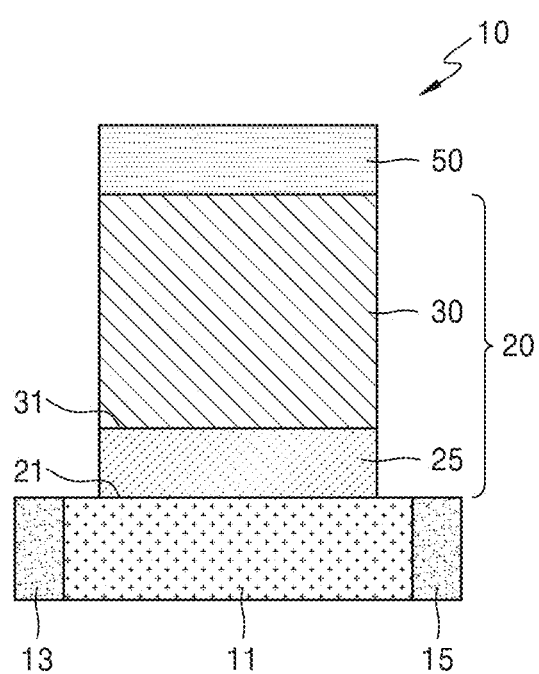
FIGS. 1 and 2 are cross-sectional views schematically illustrating ferroelectric electronic devices according to various example embodiments.

Reference will now be made in detail to various embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments will be described in detail with reference to the accompanying drawings. In the drawings, like reference numerals may denote like elements, and the size of each element may be exaggerated for clarity and convenience of description. Various embodiments described below are merely examples, and various modifications may be made therein.

As used herein, the terms "over" or "on" may include not only "directly over" or "directly on" but also "indirectly over" or "indirectly on". As used herein, the singular forms "a", "an", and "the" are intended to include the plural forms as well, unless the context clearly indicates otherwise. Also, when something is referred to as "including" an element, another element may be further included unless specified otherwise and/or clear from context.

The use of the terms "a", "an", and "the" may be construed to cover both the singular and the plural. Unless there is an explicit order or description to the contrary, operations constituting a method may be performed in a suitable order and are not necessarily limited to the described order.

Also, as used herein, the terms "units" and "modules" may refer to units that perform at least one function or operation, and the units may be implemented as hardware or software or a combination of hardware and software.

Connections or connection members of lines between the elements illustrated in the drawings may illustratively represent functional connections and/or physical or logical connections and may be represented as various replaceable or additional functional connections, physical connections, or logical connections in an actual apparatus.

All examples or illustrative terms used herein are merely intended to describe the technical concept of the disclosure in detail, and the scope of the disclosure is not limited by these examples or illustrative terms unless otherwise defined in the appended claims.

A ferroelectric electronic device according to some example embodiments may include a first layer, an insulating layer including a first interface adjacent to the first layer and a ferroelectric layer, and a metal layer (an upper electrode or a gate electrode) over the insulating layer. The insulating layer may have a bulk defect density, e.g. a defect density per cubic volume bulk material of $10^{16}$ cm$^{-3}$eV$^{-1}$ or more, and may have an interface defect density, e.g. a defect density per square area, of $10^{10}$ cm$^{-2}$eV$^{-1}$ or more. The insulating layer may further include a paraelectric layer between the first layer and the ferroelectric layer. The first interface may have a defect density per area of about $10^{10}$ cm$^{-2}$eV$^{-1}$ to about $10^{13}$ cm$^{-2}$eV$^{-1}$, and the ferroelectric layer may have a bulk defect density per volume of about $10^{17}$ cm$^{-3}$eV$^{-1}$ to about $10^{20}$ cm$^{-3}$eV$^{-1}$. A second interface between the paraelectric layer and the ferroelectric layer may have a second interface defect density of about $10^{11}$ cm$^{-2}$ev$^{-1}$ to about $10^{14}$ cm$^{-2}$ eV$^{-1}$, and the paraelectric layer may have a bulk defect density of about $10^{17}$ cm$^{-3}$eV$^{-1}$ to about $10^{20}$ cm$^{-3}$eV$^{-1}$.

In the ferroelectric electronic device according to some example embodiments, the first layer may be a channel or a lower electrode.

For example, the ferroelectric electronic device according to some example embodiments may be or may correspond to a transistor, and in this case, the first layer may be a channel, the insulating layer may be a gate insulating layer, and the upper electrode may be or correspond to a gate electrode. In this case, the gate insulating layer may include a ferroelectric layer or may include a paraelectric layer and a ferroelectric layer. For example, the ferroelectric electronic device according to some example embodiments may be or correspond to a 3-terminal device based on a ferroelectric layer and a paraelectric layer having a gate stack structure of a channel/a paraelectric layer/a ferroelectric layer/a gate electrode, or a 3-terminal device based on a ferroelectric layer having a gate stack structure of a channel/a ferroelectric layer/a gate electrode. There may be a first source/drain region adjacent to one side of the channel, and a second source/drain region adjacent to another side of the channel. There may be a first source/drain contact connected to the first source/drain region, and a second source/drain contact connected to the second source/drain region. The ferroelectric electronic device according to some example embodiment may be implemented as a memory device and/or a logic device.

The ferroelectric electronic device according to some example embodiments may be a or may correspond to 2-terminal device of a metal layer (a lower electrode)/a paraelectric layer/a ferroelectric layer/a metal layer (an upper electrode) or a 2-terminal device of a metal layer (a lower electrode)/a ferroelectric layer/a metal layer (an upper electrode). The ferroelectric electronic device according to some example embodiments may be implemented as a capacitor or as a portion of a ferroelectric memory and/or an electronic circuit to which the same is applied.

Figure 2:
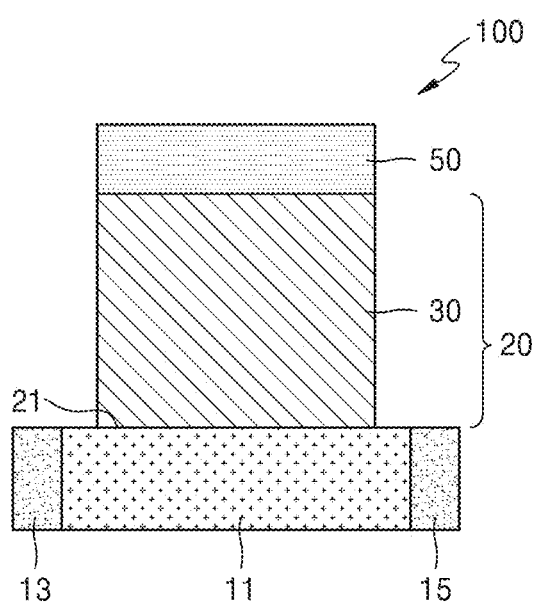

FIGS. 1 and 2 are cross-sectional views schematically illustrating ferroelectric electronic devices 10 and 100 according to some example embodiments. FIGS. 1 and 2 illustrate an example in which the ferroelectric electronic device 10/100 according to some example embodiments is implemented as a transistor.

Referring to FIGS. 1 and 2, the ferroelectric electronic device 10/100 may include a channel 11 corresponding to a first layer, an insulating layer 20 (e.g., a gate insulating layer 20) including a first interface 21 adjacent to the channel 11 and a ferroelectric layer 30, and a gate electrode 50 corresponding to an upper electrode over the gate insulating layer 20. In the ferroelectric electronic device 10 according to some example embodiments, the gate insulating layer 20 may further include a paraelectric layer 25 between the channel 11 and the ferroelectric layer 30 as illustrated in FIG. 1. The paraelectric layer 25 and the ferroelectric layer 30 may form a second interface 31 therebetween. Also, the ferroelectric electronic device 10/100 according to some example embodiments may include a source region 13 and a drain region 15 electrically connected to both ends of the channel 11. The ferroelectric electronic device 10/100 according to some example embodiments may be implemented as a memory device having two or more threshold voltages. Also, the ferroelectric electronic device 10/100 according to some example embodiments may have negative capacitance and may be implemented as a logic device, e.g. as a component in a CMOS logic device.

The channel 11 may be formed as a substrate base or may be implemented as a separate material layer. For example, when the channel 11 is formed as a substrate base, the channel 11 may include one or more semiconductor elements such as one or more of silicon (Si), germanium (Ge), silicon germanium (SiGe), silicon carbide (SiC), or a group III-V semiconductor material such as gallium arsenide (GaAs), indium arsenide (InAs), or indium phosphide (InP). Also, when the channel 11 is not formed as a substrate base and is implemented as a separate material layer, the channel 11 may include one or more of Si, Ge, SiGe, SiC, a III-V semiconductor material, an oxide semiconductor, a nitride semiconductor, an oxynitride semiconductor, a two-dimensional (2D) material, quantum dots, and/or an organic semiconductor. For example, the oxide semiconductor may include InGaZnO or the like. The 2D material may include transition metal dichalcogenide (TMD) or graphene. The TMD may include a compound of a transition metal and a chalcogen element. For example, the TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, or the like. The quantum dot may include a colloidal quantum dot (QD) or a nanocrystal structure.

When the channel 11 includes Si or Ge, the paraelectric layer 25 may be formed as a native oxide layer; for example, the paraelectric layer 25 may be formed by native oxidation of the Si or Ge. Alternatively or additionally, even when the channel 11 includes Si or Ge, the native oxide layer may be removed and the ferroelectric layer 30 may be directly formed over the channel 11. Also, an oxide layer other than the native oxide layer may be formed as the paraelectric layer 25 over the channel 11.

The source region 13 may be electrically connected to one end of the channel 11, and the drain region 15 may be electrically connected to the other end of the channel 11.

When the channel 11 is formed as a substrate base, the source region 13, the drain region 15, and the channel 11 may be formed by injecting/implanting impurities, such as at least one of boron, arsenic, or phosphorus, into different regions of a semiconductor substrate and may include a substrate material as a base material. The ferroelectric device 10/100 may be or correspond to an NMOS transistor or a PMOS transistor. For example, the channel 11 may be a Si channel. When the channel 11 is not formed as a substrate base and is implemented as a separate material layer, the source region 13 and the drain region 15 may be formed of a conductive material. For example, the source region 13 and the drain region 15 may include a metal, a metal compound, or a conductive polymer.

In the ferroelectric electronic device 10/100 according to some example embodiments, the gate insulating layer 20 may be formed to have a bulk defect density of $10^{16}$ $cm^{-3}eV^{-1}$ or more, and an interface defect density of $10^{10}$ $cm^{-2}eV^{-1}$ or more. As used herein, a "bulk defect density" may correspond to a density of defects within a cubic volume, and an "interface defect density" may correspond to a density of defects within a square area.

The ferroelectric electronic device 10/100 according to some example embodiments may have a defect density of about $10^{10}$ $cm^{-2}eV^{-1}$ to about $10^{13}$ $cm^{-2}eV^{-1}$ at the first interface 21 with the channel 11. As illustrated in FIG. 1, when the gate insulating layer 20 includes the paraelectric layer 25 and the ferroelectric layer 30, the first interface 21 may correspond to the interface between the channel 11 and the paraelectric layer 25. As illustrated in FIG. 2, when the gate insulating layers 20 includes only the ferroelectric layer 30, the first interface 21 may correspond to the interface between the channel 11 and the ferroelectric layer 30.

For example, as illustrated in FIG. 1, the gate insulating layer 20 may include the paraelectric layer 25 and the ferroelectric layer 30, and the paraelectric layer 25 may form the first interface 21 with the channel 11 and may be located between the channel 11 and the ferroelectric layer 30. The ferroelectric layer 30 may form the second interface 31 with the paraelectric layer 25. In this case, the paraelectric layer 25 may have an interface defect density (per area) of about $10^{10}$ $cm^{-2}eV^{-1}$ to about $10^{13}$ $cm^{-2}eV^{-1}$ at the first interface 21 with the channel 11 and may have a bulk defect density (per volume) of about $10^{17}$ $cm^{-3}eV^{-1}$ to about $10^{20}$ $cm^{-3}eV^{-1}$. Also, the second interface 31 between the paraelectric layer 25 and the ferroelectric layer 30 may have an interface defect density per area of about $10^{11}$ $cm^{-2}eV^{-1}$ to about $10^{14}$ $cm^{-2}eV^{-1}$, and the ferroelectric layer 30 may have a bulk defect density per volume of about $10^{17}$ $cm^{-3}eV^{-1}$ to about $10^{20}$ $cm^{-3}eV^{-1}$.

Also, for example, as illustrated in FIG. 2, the gate insulating layer 20 may be provided such that the ferroelectric layer 30 may form the first interface 21 with the channel 11. In this case, the ferroelectric layer 30 may have an interface defect density of about $10^{10}$ $cm^{-2}eV^{-1}$ to about $10^{13}$ $cm^{-2}eV^{-1}$ at the first interface 21 with the channel 11 and may have a bulk defect density of about $10^{17}$ $cm^{-3}eV^{-1}$ to about $10^{20}$ $cm^{-3}eV^{-1}$.

The paraelectric layer 25 may include at least one of SiO, AlO, SiON, and SiN. For example, the channel 11 may include a Si material, $SiO_2$ as a native (grown) oxide layer may be formed as the paraelectric layer 25, and the ferroelectric layer 30 may be formed thereover/on the paraelectric layer 25. The paraelectric layer 25 may include a plurality of layers having different dielectric constants.

The ferroelectric layer 30 may be or may include an oxide including at least one of Hf and Zr and may further include at least one type of dopant among Si, Al, Y, La, Gd, Sr, C, Ge, Sn, Pb, Mg, Ca, Ba, and Ti.

For example, the ferroelectric layer 30 may include at least one of hafnium oxide ($HfO_2$), zirconium oxide ($ZrO_2$), and hafnium-zirconium oxide ($Hf_xZr_{1-x}O_2$, where $0<x<1$). Such a metal oxide may exhibit ferroelectricity even in a very thin layer of several nm level.

Also, for example, the ferroelectric layer 30 may include at least one of hafnium oxide ($HfO_2$), zirconium oxide ($ZrO_2$), and hafnium-zirconium oxide ($Hf_xZr_{1-x}O_2$, where $0<x<1$) as a base material, and may further include at least one dopant among Si, Al, Y, La, Gd, Sr, C, Ge, Sn, Pb, Mg, Ca, Ba, and Ti. The dopant content with respect to the metal element of the base material may be, for example, more than 0 at %, 0.2 at % or more, 0.5 at % or more, 1 at % or more, 2 at % or more, 3 at % or more, 10 at % or less, 8 at % or less, 7 at % or less, or 6 at % or less.

The ferroelectric layer 30 may include or have atoms arranged according to an orthorhombic crystalline phase. For example, the ferroelectric layer 30 may include materials having various crystalline phases such as an orthorhombic crystalline phase and a tetragonal crystalline phase and may include, for example, a material having an orthorhombic crystalline phase dominantly or at the greatest ratio among all the crystalline phases.

The ferroelectric layer 30 may be distinguished from a high dielectric or the like according to the existence or lack of presence of, or amount of or a size of residual polarization, the composition of a metal oxide, the type and ratio of a doping element, the crystalline phase, and/or the like. For example, one or more of X-ray photoelectron spectroscopy (XPS), Auger electron spectroscopy (AES), inductively coupled plasma (ICP), or the like may be used to measure the type and content of each element. Alternatively or additionally, for example, one or more of transmission electron microscopy (TEM), grazing incidence X-ray diffraction (GIXRD), or the like may be used to identify a crystalline phase distribution.

The gate electrode 50 may include one or more of a metal, a metal nitride, a metal carbide, polysilicon, and/or a 2D conductive material. For example, the metal may include aluminum (Al), tungsten (W), molybdenum (Mo), titanium (Ti), and/or tantalum (Ta). The metal nitride may include titanium nitride (TiN) and/or tantalum nitride (TaN). The metal carbide may be or may include a metal carbide doped with (or containing) aluminum and/or silicon and may include, for example, one or more of TiAlC, TaAlC, TiSiC, or TaSiC. The gate electrode 50 may have a structure in which a plurality of materials are stacked and may have, for example, a stack structure of a metal nitride layer/a metal layer such as TiN/Al or a stack structure of a metal nitride layer/a metal carbide layer/a metal layer such as TiN/TiAlC/W.

Figure 3:
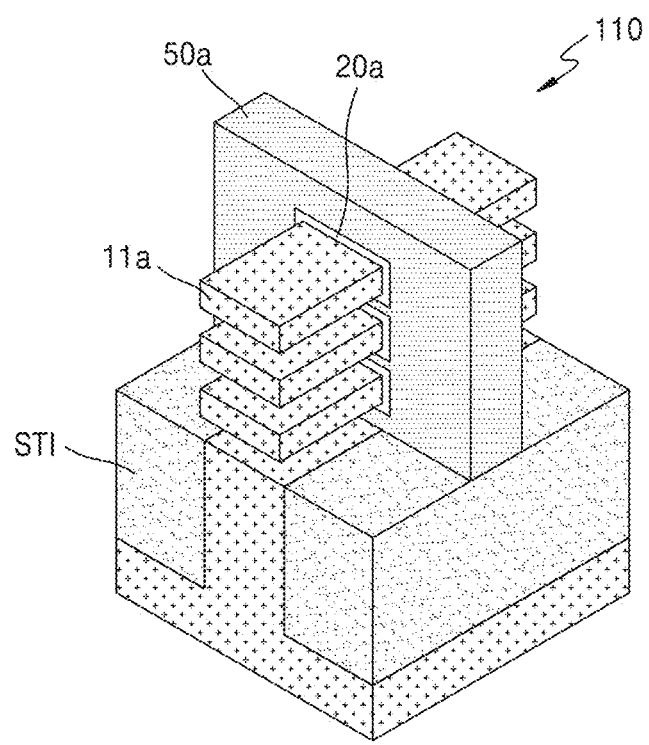
FIGS. 3 to 5 illustrate examples in which ferroelectric electronic devices according to various example embodiments are formed in three-dimensional (3D) structures including a gate-all-around (GAA) channel, a nanosheet channel, and a fin channel respectively.
Figure 4:
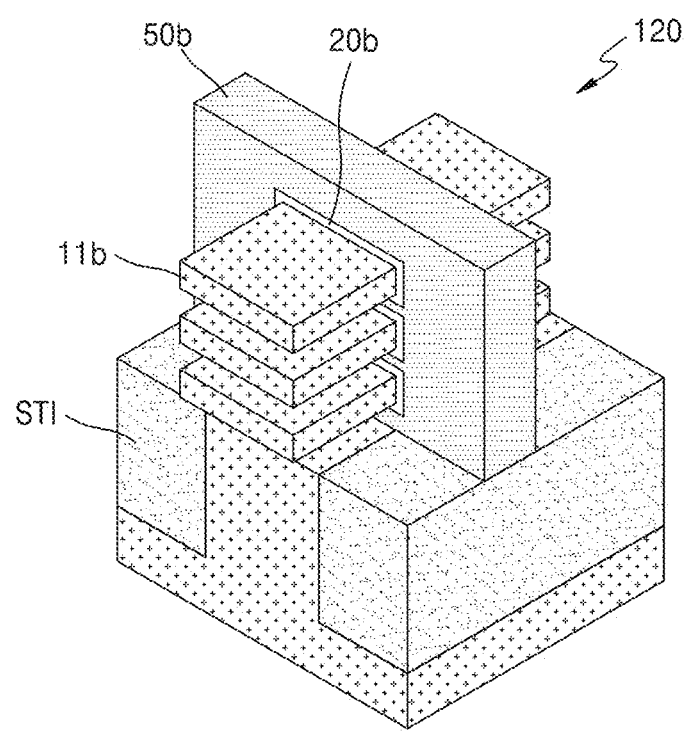
Figure 5:
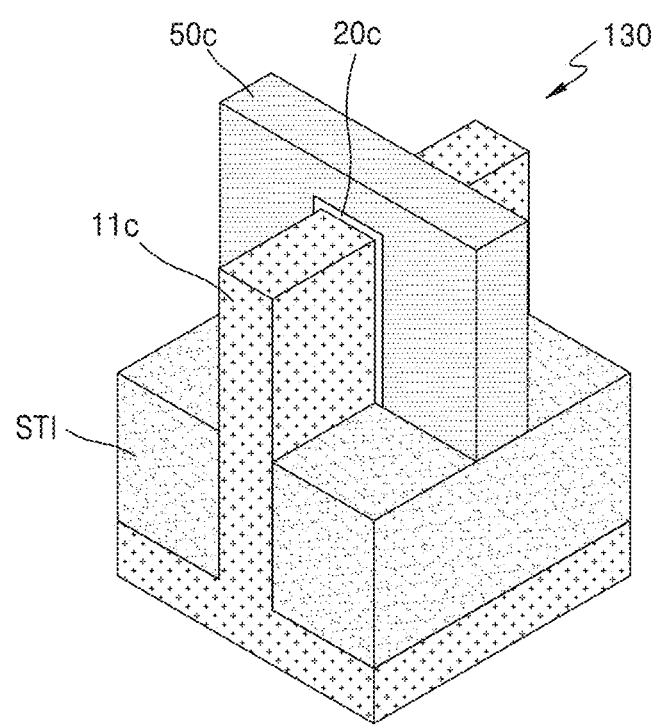

In the ferroelectric electronic device 10/100 according to some example embodiments, the channel 11 may have a planar structure as illustrated in FIGS. 1 and 2 or may have various other channel structures, for example, channel structures such as a gate-all-around channel, a nanosheet channel, and a fin channel as in FIGS. 3 to 5.

For example, in the ferroelectric electronic device 10/100 according to some example embodiments, the gate insulating layer 20 may be provided to have a bulk defect density of $10^{16}$ $cm^{-3}eV^{-1}$ or more and an interface defect density of $10^{10}$ $cm^{-2}eV^{-1}$ or more and the channel structure may be provided in various forms.

FIGS. 3 to 5 illustrate examples in which ferroelectric electronic devices 110, 120, and 130 according to various example embodiments are formed in three-dimensional (3D) structures including a gate-all-around (GAA) channel 11a, a nanosheet channel 11b, and a fin channel 11c respectively.

Referring to FIG. 3, the ferroelectric electronic device 110 according to some example embodiments may be provided to have the GAA channel 11a. Referring to FIG. 4, the ferroelectric electronic device 120 according to some example embodiments may be provided to have the nanosheet channel 11b. Referring to FIG. 5, the ferroelectric electronic device 130 according to some example embodiments may be provided to have the fin channel 11c.

Referring to FIGS. 3 to 5, for example, a shallow trench insulator (STI) may be formed, and a gate electrode 50a/50b/50c may be formed to surround a channel 11a/11b/11c. The STI may be formed by forming a shallow trench around the channel 11a/11b/11c and/or an area corresponding to the channel 11a/11b/11c and filling the trench with an insulating material. The gate electrode 50a/50b/50c may be formed over the STI to surround the channel 11a/11b/11c. A gate insulating layer 20a/20b/20c may be provided between the channel 11a/11b/11c and the gate electrode 50a/50b/50c. For example, by forming the gate insulating layer 20a/20b/20c to surround the channel 11a/11b/11c and forming the gate electrode 50a/50b/50c to surround the gate insulating layer 20a/20b/20c, it may be possible to form ferroelectric electronic devices having various channel structures such as a GAA channel, a nanosheet channel, and a fin channel as illustrated in FIGS. 3 to 5.

Moreover, as in the ferroelectric electronic device 10/100 described with reference to FIGS. 1 and 2, in the ferroelectric electronic device 110/120/130 according to the embodiments of FIGS. 3 to 5, the gate insulating layer 20a/20b/20c may include a paraelectric layer forming a first interface with the channel 11a/11b/11c and a ferroelectric layer forming a second interface with the paraelectric layer or may include only a ferroelectric layer forming a first interface with the channel 11a/11b/11c.

Also, as in the ferroelectric electronic device 10/100 according to various embodiments, in the ferroelectric electronic device 110/120/130 according to some example embodiments, the gate insulating layer 20a/20b/20c may have a bulk/cubic defect density of $10^{16}$ cm$^{-3}$eV$^{-1}$ or more and an interface/square defect density of $10^{10}$ cm$^{-2}$eV$^{-1}$ or more. For example, in the gate insulating layer 20a/20b/20c, the first interface may have a defect density of about $10^{10}$ cm$^{-2}$eV$^{-1}$ to about $10^{13}$ cm$^{-2}$eV$^{-1}$ and the ferroelectric layer may have a bulk defect density of about $10^{17}$ cm$^{-3}$eV$^{-1}$ to about $10^{20}$ cm$^{-3}$eV$^{-1}$. Also, when the gate insulating layer 20a/20b/20c further includes a paraelectric layer between the channel 11a/11b/11c and the ferroelectric layer, the second interface between the paraelectric layer and the ferroelectric layer may have an interface defect density of about $10^{11}$ cm$^{-2}$eV$^{-1}$ to about $10^{14}$ cm$^{-2}$eV$^{-1}$ and the paraelectric layer may have a bulk defect density of about $10^{17}$ cm$^{-3}$eV$^{-1}$ to about $10^{20}$ cm$^{-3}$eV$^{-1}$.

Here, the nanosheet channel 11b may have a greater width than the GAA channel 11a and may correspond to an example of the GAA channel 11a. As another example, the GAA channel 11a may be implemented as a nanowire channel that is narrow. The nanosheet channel 11b may represent or correspond to a channel having a greater width than the GAA channel 11a, and the nanowire channel may represent or correspond to a channel having a smaller width than the GAA channel 11a. For example, as a structure surrounding a channel with a gate electrode, the structure may be distinguished into a GAA channel, a nanosheet channel, and a nanowire channel according to the width of the channel.

Moreover, in the ferroelectric electronic device 110/120/130 according to some example embodiments, because the channel 11a/11b/11c corresponds to the channel 11 described above, the gate insulating layer 20a/20b/20c corresponds to the gate insulating layer 20 described above, and the gate electrode 50a/50b/50c corresponds to the gate electrode 50 described above, redundant descriptions of the channel 11a/11b/11c, the gate insulating layer 20a/20b/20c, and the gate electrode 50a/50b/50c already given above with respect to the channel 11, the gate insulating layer 20, and the gate electrode 50 will be omitted for conciseness.

Moreover, the ferroelectric electronic device 10/100/110/120/130 according to various embodiments described above with reference to FIGS. 1 to 5 may be implemented as a memory device (e.g. a memory cell or memory unit) and/or a logic device (e.g. a component of a CMOS standard cell) including the channel 11, the gate insulating layer 20, and the gate electrode 50 and may be applied as a portion of an electronic circuit implemented as an integrated device.

Figure 6:
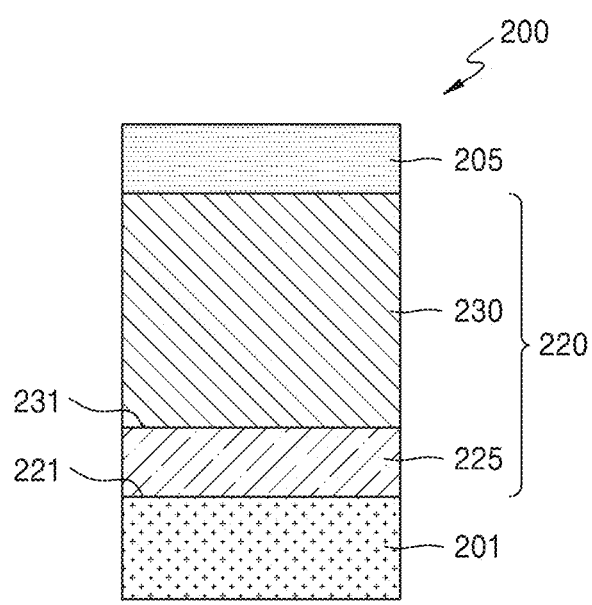
FIGS. 6 and 7 are cross-sectional views schematically illustrating ferroelectric electronic devices according to other embodiments.
Figure 7:
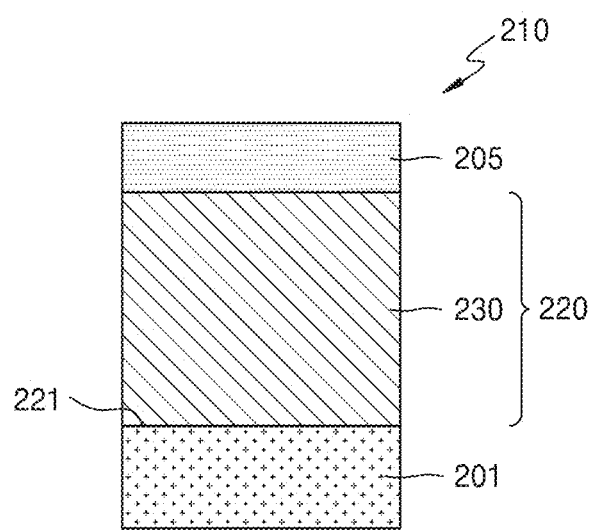

As another example, as in FIGS. 6 and 7, the ferroelectric electronic device according to some example embodiments may include a lower electrode 201 (a metal layer) as a first layer and may be implemented as a capacitor. Also, the ferroelectric electronic device according to some example embodiments may be implemented as a capacitor and may be a portion of an electronic circuit implemented as an integrated device.

FIGS. 6 and 7 are cross-sectional views schematically illustrating ferroelectric electronic devices 200 and 210 according to various embodiments.

Referring to FIGS. 6 and 7, the ferroelectric electronic device 200/210 according to some embodiments may include a lower electrode 201 and an upper electrode 205 spaced apart from each other and an insulating layer 220 arranged therebetween. The lower electrode 201 may correspond to a first layer. The insulating layer 220 may include a first interface 221 adjacent to the lower electrode 201 and a ferroelectric layer 230. FIG. 6 illustrates an example in which the insulating layer 220 includes the ferroelectric layer 230 and a paraelectric layer 225 between the lower electrode 201 and the ferroelectric layer 230. FIG. 7 illustrates an example in which the insulating layer 220 includes only the ferroelectric layer 230. The ferroelectric electronic device 200/210 according to some example embodiments may be provided to have negative capacitance and may be implemented as a capacitor and/or a ferroelectric memory (ferroelectric memory cell).

The upper electrode 205 and the lower electrode 201 may include a conductive material. For example, the upper electrode 205 and the lower electrode 201 may include a metal, an alloy thereof, a metal nitride, a metal carbide, a metal oxide, a 2D conductive material, or any combination thereof. For example, the metal may include at least one of aluminum (Al), tungsten (W), molybdenum (Mo), titanium (Ti), tantalum (Ta), chromium (Cr), and copper (Cu), or any alloy thereof. The metal nitride may include, for example, titanium nitride (TiN), tantalum nitride (TaN), or the like. The metal carbide may include a metal carbide doped with (or containing) at least one of aluminum and silicon, for example, TiAlC, TaAlC, TiSiC, or TaSiC. The metal oxide may include, for example, an indium oxide ($In_2O_3$), a tin oxide ($SnO_2$), a zinc oxide (ZnO), an indium oxide-tin oxide alloy ($In_2O_3$—$SnO_2$ (ITO)), an indium oxide-zinc oxide alloy ($In_2O_3$—ZnO), or the like. At least one of the upper electrode 205 and the lower electrode 201 may include a plurality of layers and may have, for example, a stack structure of a metal nitride layer/a metal layer or a stack structure of a metal nitride layer/a metal carbide layer/a metal layer.

The ferroelectric layer 230 may correspond to the ferroelectric layer 30 described above with reference to FIG. 1, may be an oxide including at least one of Hf and Zr, and may further include at least one type of dopant among Si, Al, Y, La, Gd, Sr, C, Ge, Sn, Pb, Mg, Ca, Ba, and Ti. Redundant descriptions of the ferroelectric layer 230 already given above with respect to the ferroelectric layer 30 will be omitted for conciseness.

The paraelectric layer 225 may correspond to the paraelectric layer 25 described above with reference to FIG. 1 and may include at least one of SiO, AlO, SiON, and SiN. The paraelectric layer 225 may include a plurality of layers having different dielectric constants. Redundant descriptions of the paraelectric layer 225 already given above with respect to the paraelectric layer 25 will be omitted for conciseness.

In the ferroelectric electronic device 200/210 according to another embodiment, the insulating layer 220 may have a bulk (cubic) defect density of $10^{16}$ cm$^{-3}$eV$^{-1}$ or more and an interface (square) defect density of $10^{10}$ cm$^{-2}$eV$^{-1}$ or more.

For example, as illustrated in FIG. 6, the insulating layer 220 may include a paraelectric layer 225 and a ferroelectric layer 230, and the paraelectric layer 225 may form a first interface 221 with the lower electrode 201 and a second interface 231 with the ferroelectric layer 230. In this case, the first interface 221 may have an interface defect density of about $10^{10}$ cm$^{-2}$eV$^{-1}$ to about $10^{13}$ cm$^{-2}$eV$^{-1}$, and the second interface 231 may have an interface defect density of about $10^{11}$ cm$^{-2}$eV$^{-1}$ to about $10^{13}$ cm$^{-2}$eV$^{-1}$. Each of the paraelectric layer 225 and the ferroelectric layer 230 may have a bulk defect density of about $10^{17}$ cm$^{-3}$eV$^{-1}$ to about $10^{20}$ cm$^{-3}$eV$^{-1}$.

Also, for example, as illustrated in FIG. 7, the insulating layer 220 may include a ferroelectric layer 230, and the ferroelectric layer 230 may form or correspond to a first interface 221 with the lower electrode 201. In this case, the first interface 221 may have a defect density of about $10^{10}$ cm$^{-2}$eV$^{-1}$ to about $10^{13}$ cm$^{-2}$eV$^{-1}$, and the ferroelectric layer 230 may have a bulk defect density of about $10^{17}$ cm$^{-3}$eV$^{-1}$ to about $10^{20}$ cm$^{-3}$eV$^{-1}$.

Figure 8:
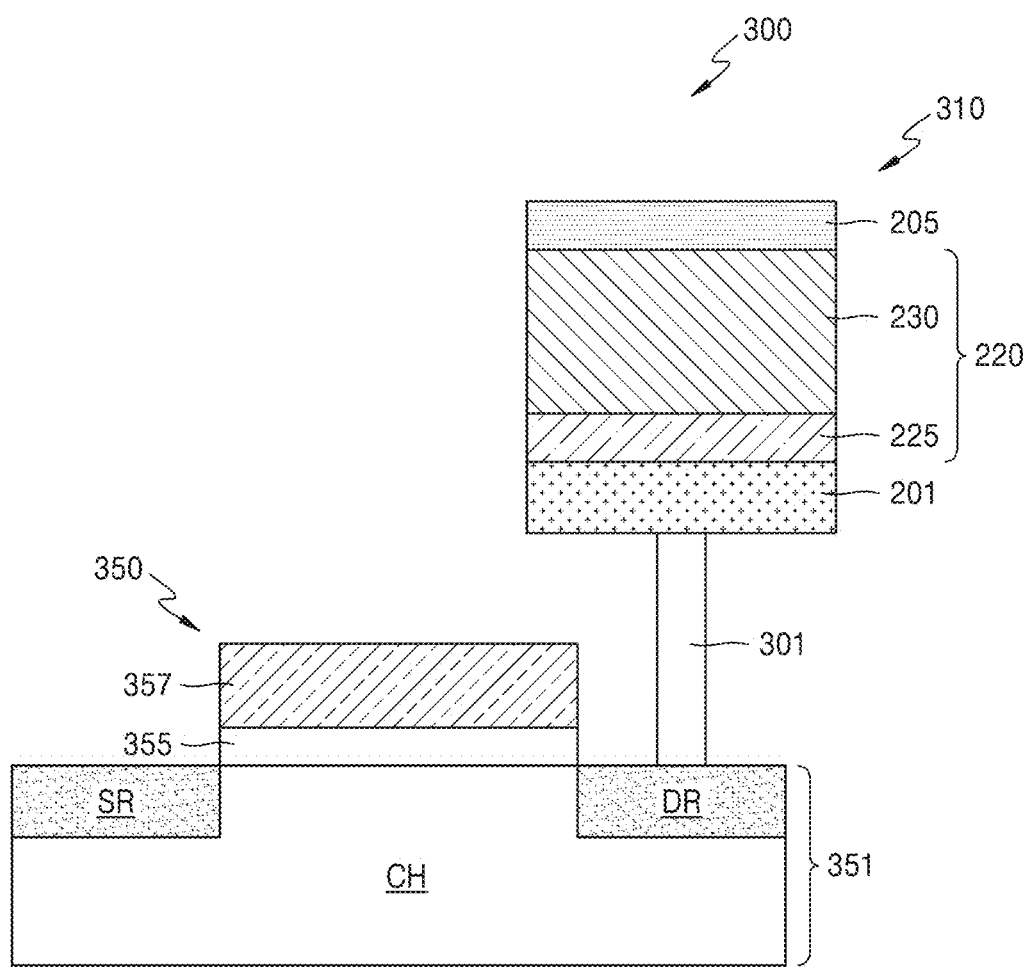
FIG. 8 schematically illustrates an example of applying a ferroelectric electronic device according to some example embodiments.

FIG. 8 schematically illustrates an example of applying a ferroelectric electronic device according to some example embodiments.

Referring to FIG. 8, an electronic device 300 may include a structure in which a capacitor 310 and a transistor 350 are electrically connected to each other and may be a portion of an electronic circuit implemented as an integrated device. The electronic device 300 may further include at least one transistor.

The ferroelectric electronic device 200 or 210 of FIG. 6 or 7 may be applied as the capacitor 310. The capacitor 310 may have, for example, a stack structure of a lower electrode 201, an insulating layer 220, and an upper electrode 205, and the insulating layer 220 may include a paraelectric layer 225 and a ferroelectric layer 230 or may include only the ferroelectric layer 230. FIG. 8 illustrates a case where the ferroelectric electronic device of FIG. 6 is applied as the capacitor 310.

The capacitor 310 may be electrically connected to the transistor 350 by a contact 301. The transistor 350 may be a field effect transistor or an access transistor, and may or may not correspond to any of the ferroelectric devices described above with reference to FIGS. 1-7. One of the electrodes 201 and 205 of the capacitor 310 and one of a source region SR and a drain region DR of the transistor 350 may be electrically connected to each other by the contact 301.

The transistor 350 may include a semiconductor substrate 351 including an source region SR, an drain region DR, and an n channel CH, and an gate electrode 357 arranged to face the channel CH and may also include an gate insulating layer 355 arranged between the channel CH and the gate electrode 357.

The semiconductor substrate 351 may include a semiconductor material. The semiconductor substrate 351 may include an source region SR, an drain region DR, and an channel CH electrically connected to the source region SR and the drain region DR. The source region SR may be electrically connected to or contact one end of the channel CH, and the drain region DR may be electrically connected or contact the other end of the channel CH. In other words, the channel CH may be defined as a substrate region between the source region SR and the drain region DR in the semiconductor substrate 351.

The source region SR, the drain region DR, and the channel CH may be respectively independently formed by implanting/injecting impurities into different areas of the semiconductor substrate 351, and in this case, the source region SR, the channel CH, and the drain region DR may include a substrate material as a base material. Also, the source region SR and the drain region DR may be formed of a conductive material. The channel CH may not be formed as a substrate base and may be implemented as a separate material layer.

The gate electrode 357 may be arranged over the semiconductor substrate 351 to face the channel CH while being spaced apart from the semiconductor substrate 351.

The gate insulating layer 355 arranged between the semiconductor substrate 351 and the gate electrode 357 may include a paraelectric material or a high dielectric material. The gate insulating layer 355 may constitute a gate stack together with the gate electrode 357.

The ferroelectric electronic device 10/100 according to the embodiments described with reference to FIGS. 1 and 2 may or may not be applied as the transistor 350. Alternatively or additionally, the transistor 350 may have various channel structures like the ferroelectric electronic device 110/120/130 described with reference to FIGS. 3 to 5.

The contact 301 may include a suitable conductive material such as tungsten, copper, aluminum, or polysilicon.

The arrangement of the capacitor 310 and the transistor 350 may be variously modified. For example, the capacitor 310 may be arranged over the semiconductor substrate 351 as illustrated or may have a structure buried in the semiconductor substrate 351.

Although FIG. 8 illustrates the electronic device 300 including one capacitor 310 and one transistor 350, at least one of which may include the ferroelectric layer described above, there may be a structure in which such a structure is repeatedly arranged two-dimensionally.

Figure 9A:
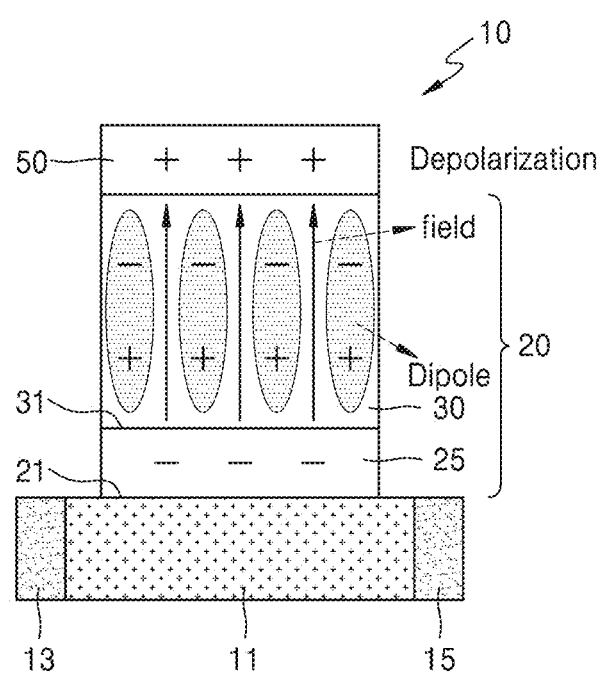
FIGS. 9A and 9B illustrate a polarization phenomenon in the ferroelectric electronic device of FIG. 1.
Figure 9B:
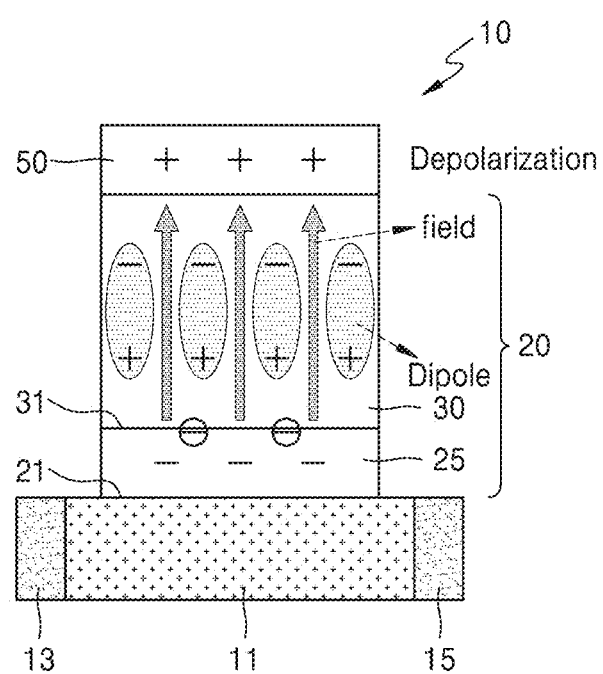

FIGS. 9A and 9B illustrate a polarization phenomenon in the ferroelectric electronic device 10 of FIG. 1. FIG. 9A illustrates a state in which a potential difference applied to the ferroelectric layer 230 is increased and a polarization phenomenon is strengthened by applying an external electric field, and FIG. 9B illustrates a state in which a potential difference applied to the ferroelectric layer 230 is reduced and a polarization phenomenon is weakened (or a depolarization phenomenon is strengthened) due to a defect.

Referring to FIGS. 9A and 9B, the ferroelectric electronic device 10 may have a stack structure of a channel 11/a paraelectric layer 25/a ferroelectric layer 30/and a gate electrode 50.

As in FIG. 9A, when an external electric field is applied to the ferroelectric electronic device 10, a potential difference applied to the ferroelectric layer 30 may be increased, and a polarization phenomenon may be strengthened. When there are no or fewer defects, there may be a strong polarization effect. As in FIG. 9B, for example, when there is a defect in the paraelectric layer 25 and/or the second interface 31 between the ferroelectric layer 30 and the paraelectric layer 25, a potential difference applied to the ferroelectric layer 30 may be reduced and a polarization effect may be weakened as indicated by the smaller dipole ovals, for example, a depolarization phenomenon may be strengthened, as indicated by the thicker field lines.

Figure 10A:
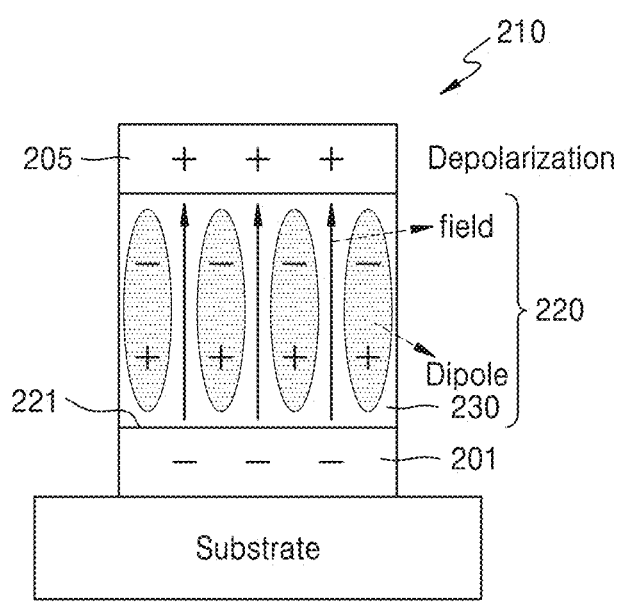
FIGS. 10A and 10B illustrate a polarization phenomenon in the ferroelectric electronic device of FIG. 7.
Figure 10B:
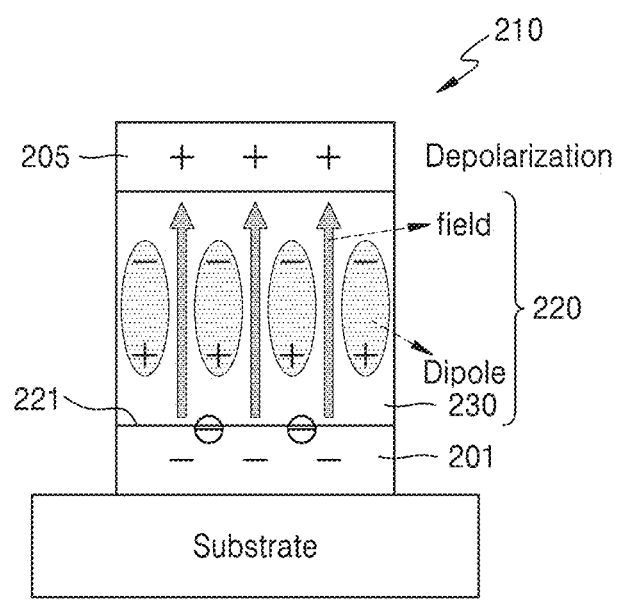

FIGS. 10A and 10B illustrate a polarization phenomenon in the ferroelectric electronic device 210 of FIG. 7. FIG. 10A illustrates a state in which a potential difference applied to the ferroelectric layer 230 is increased and a polarization phenomenon is strengthened by applying an external electric field, and FIG. 10B illustrates a state in which a potential difference applied to the ferroelectric layer 230 is reduced and a polarization phenomenon is weakened (e.g. a depolarization phenomenon is strengthened) due to a defect.

Referring to FIGS. 10A and 10B, the ferroelectric electronic device 210 may have a stack structure of a metal layer such as a lower electrode 201/a ferroelectric layer 230/a metal layer such as an upper electrode 205. FIGS. 10A and 10B illustrate an example in which the stack structure of the ferroelectric electronic device 210 according to some example embodiments is formed over a substrate.

As in FIG. 10A, when an external electric field is applied to the ferroelectric electronic device 210, a potential difference applied to the ferroelectric layer 230 may be increased and a polarization phenomenon may be strengthened. As in FIG. 10B, when there is a defect in the first interface 221 between the ferroelectric layer 230 and the lower electrode 201, a potential difference applied to the ferroelectric layer 230 may be reduced and a polarization phenomenon may be weakened, or correspondingly, a depolarization phenomenon may be strengthened.

In FIGS. 9A, 9B, 10A, and 10B, the size of a dipole may represent the degree of strengthening of a polarization effect. Also, in FIGS. 9A, 9B, 10A, and 10B, an arrow may represent a field inducing a depolarization phenomenon, and the thickness/weight of an arrow may represent the strength of a field inducing a depolarization phenomenon.

As in FIGS. 9A and 10A, a polarization phenomenon may be strengthened as a potential difference applied to the ferroelectric layer 30/230 is increased by applying an external electric field. On the other hand, as in FIGS. 9B and 10B, when there is one or more defects, e.g. one or more interface defects, a depolarization phenomenon may be strengthened to weaken an electric field applied to the ferroelectric layer 30/230 and a polarization phenomenon may be weakened to reduce ferroelectric properties.

As in FIGS. 9A and 10A, when a field inducing a depolarization is weak, a polarization phenomenon may be strengthened in the ferroelectric layer 30/230 according to application of an external electric field. On the other hand, as in FIGS. 9B and 10B, when a field inducing a depolarization is strengthened due to the existence of a defect, a polarization phenomenon in the ferroelectric layer 30/230 may be weakened.

As such, when there is a defect e.g. due to an interface defect, a depolarization phenomenon may be strengthened and correspondingly an electric field applied to the ferroelectric layer 30/230 may be weakened, which may reduce ferroelectric properties.

Thus, as may be seen from the comparison between FIGS. 9A and 9B and the comparison between FIGS. 10A and 10B, in order to improve ferroelectric properties, it may be necessary or desirable to strengthen the electric field in the ferroelectric layer 30/230 and/or reduce the number of defects. Thus, in order to obtain desired ferroelectric properties, it may be necessary or desirable to control the amount and distribution of defects in the gate insulating layer 20 and/or the insulating layer 220 and/or at the interface thereof.

In the ferroelectric electronic device, the amount of and/or the distribution of defects in the interface and the insulating layer may result from the stress of the process and the device operation. Thus, when a defect in the interface and the insulating layer is more accurately identified and fed back to the process, a ferroelectric electronic device having further improved ferroelectric properties may be manufactured/fabricated.

Figure 11A:
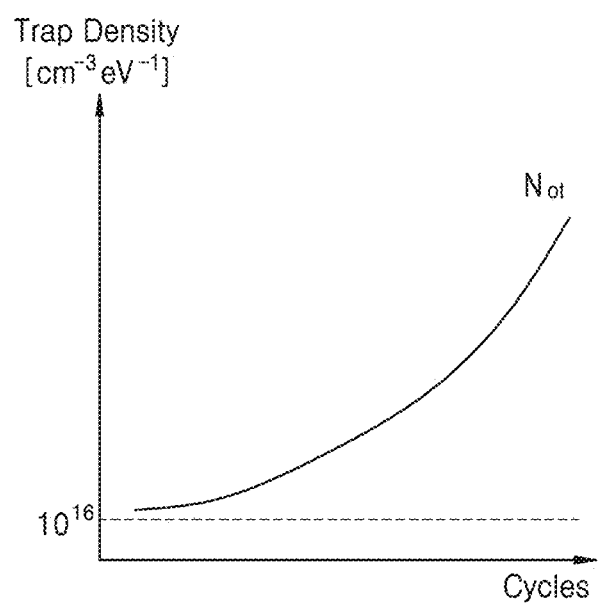
FIG. 11A is a graph illustrating a bulk trap density (i.e., bulk defect density) change according to the number of operations of a ferroelectric electronic device according to some example embodiments.
Figure 11B:
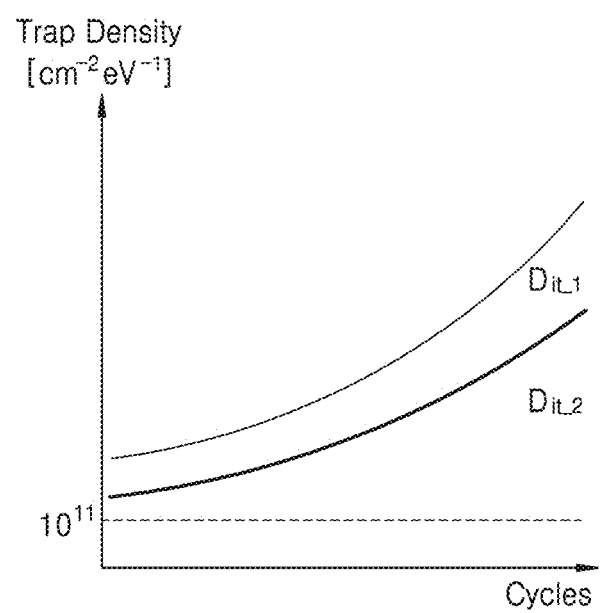
FIG. 11B is a graph illustrating a trap density (defect density) change at an interface according to the number of operations of a ferroelectric electronic device according to some example embodiments.
Figure 11C:
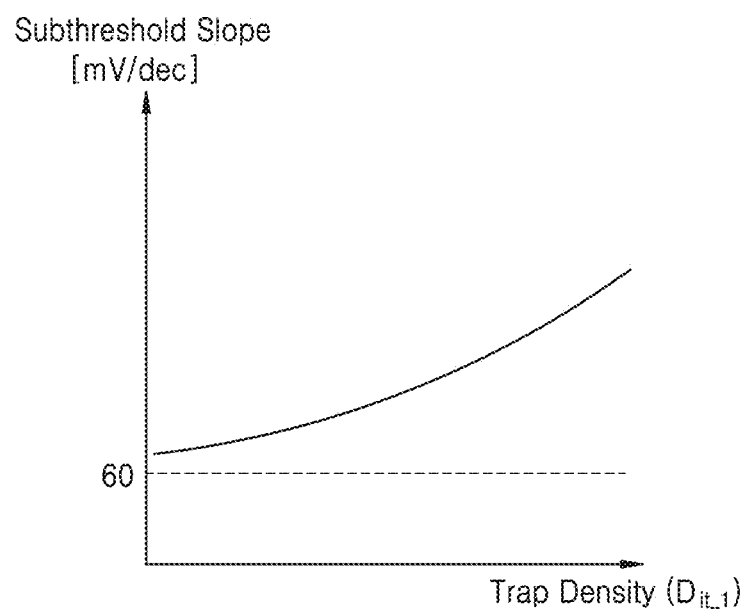
FIG. 11C is a graph illustrating a subthreshold slope change according to a trap density (defect density) change at an interface between a channel and a gate insulating layer of a ferroelectric electronic device according to some example embodiments.

FIG. 11A is a graph illustrating a bulk trap density (e.g., bulk defect density) change depending on the number of operations/cycles of a ferroelectric electronic device according to some example embodiments. FIG. 11B is a graph illustrating a trap density (defect density) change at an interface depending on the number of operations/cycles of a ferroelectric electronic device according to some example embodiments. FIG. 11C is a graph illustrating a subthreshold slope change depending on a trap density (defect density) change at an interface between a channel and a gate insulating layer of a ferroelectric electronic device according to some example embodiments. FIGS. 11A to 11C illustrate a case where a ferroelectric electronic device according to some example embodiments has a stack structure of a channel/a paraelectric layer/a ferroelectric layer/a gate electrode.

Referring to FIG. 11A, a bulk trap density, for example, a bulk defect density $N_{ot}$, in the gate insulating layer of the ferroelectric electronic device according to some example embodiments may have a value of at least $10^{16}$ cm$^{-3}$eV$^{-1}$ and may increase up to about $10^{19}$ cm$^{-3}$eV$^{-1}$ as the number of operations increases.

Referring to FIG. 11B, an interface trap density (defect density) $D_{it\_1}$ at the first interface between the channel and the paraelectric layer of the ferroelectric electronic device according to some example embodiments and a trap density (defect density) Dit_2 at the second interface between the paraelectric layer and the ferroelectric layer may have a value of at least $10^{11}$ cm$^{-2}$eV$^{-1}$ and may increase up to about $10^{13}$ cm$^{-2}$eV$^{-1}$ as the number of operations increases.

Referring to FIG. 11C, it may be seen that the amount of interface defects at the first interface between the channel and the paraelectric layer of the ferroelectric electronic device according to some example embodiments may affect the switching characteristics of the device, and a subthreshold slope (SS) may increase above at least 60 mV/dec that is a physical limit value as the number of defects increases. A subthreshold slope (SS) value may be an index indicating the switching characteristics in a logic device, and an increase in the subthreshold slope may lead to an increase in the leakage current and/or an increase in the required/consumed power.

As described above, according to the ferroelectric electronic device according to some example embodiments, because the insulating layer or the gate insulating layer has a bulk defect density of $10^{16}$ cm$^{-3}$eV$^{-1}$ or more and an interface defect density of $10^{10}$ cm$^{-2}$eV$^{-1}$ or more, ferroelectric properties suitable for implementing a logic device or a memory device may be achieved.

Whether the ferroelectric electronic device according to various embodiments described above has a set defect density in order to achieve desired ferroelectric properties may be identified in the following way.

Figure 17:
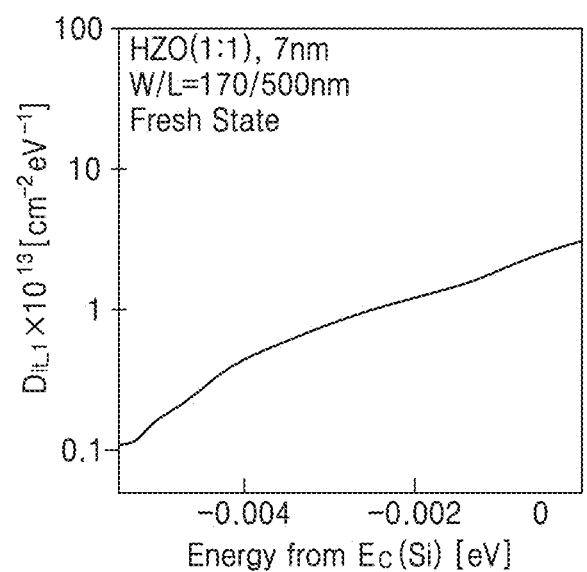
FIG. 17 illustrates a principle of extracting a defect density at a Si channel interface of a ferroelectric electronic device according to some example embodiments by using a current-voltage measurement method.

According to a method of extracting a defect density of a ferroelectric electronic device according to some example embodiments, for example, as in various embodiments described above, when the ferroelectric electronic device includes a first layer, an insulating layer including a first interface adjacent to the first layer and a ferroelectric layer, and an upper electrode over the insulating layer, a bulk defect density in the insulating layer may be extracted by low-frequency noise analysis as in FIGS. 12 to 15, and an interface defect density in the first interface region may be extracted by a current-voltage measurement method as in FIG. 17. Here, a capacitance-voltage measurement method may be applied instead of the current-voltage measurement method.

In the ferroelectric electronic device to which a defect density extracting method according to some example embodiments is applied, the first layer may be a channel or a metal layer (a lower electrode) and the insulating layer may further include or may not include a paraelectric layer between the first layer and the ferroelectric layer.

For example, when the first layer is a channel and the paraelectric layer is located between the channel and the ferroelectric layer, the first interface may correspond to the interface between the channel and the paraelectric layer. When the first layer is a channel and the paraelectric layer is not located between the channel and the ferroelectric layer, the first interface may correspond to the interface between the channel and the ferroelectric layer. When the first layer is a metal layer (e.g. a lower electrode) and the paraelectric layer is located between the channel and the ferroelectric layer, the first interface may correspond to the interface between the channel and the paraelectric layer. When the first layer is a metal layer (e.g. a lower electrode) and the paraelectric layer is not located between the channel and the ferroelectric layer, the first interface may correspond to the interface between the channel and the ferroelectric layer. The extraction of a defect density in the first interface region may be performed by a current-voltage measurement method.

When the first layer is a channel and the paraelectric layer is located between the channel and the ferroelectric layer, the extraction of a defect density by low-frequency noise analysis may be performed from a position spaced apart from the channel by a certain distance over the paraelectric layer, the second interface between the paraelectric layer and the ferroelectric layer, and a partial region of the ferroelectric layer. Also, when the first layer is a channel and the paraelectric layer is not located between the channel and the ferroelectric layer, the extraction of a defect density by low-frequency noise analysis may be performed over a certain range from a position in the ferroelectric layer spaced apart from the channel by a certain distance.

When the first layer is a metal layer (e.g. a lower electrode) and the paraelectric layer is located between the channel and the ferroelectric layer, the extraction of a defect density by low-frequency noise analysis may be performed from a position spaced apart from the metal layer by a certain distance over the paraelectric layer, the second interface between the paraelectric layer and the ferroelectric layer, and a partial region of the ferroelectric layer. Also, when the first layer is a metal layer (e.g. a lower electrode) and the paraelectric layer is not located between the channel and the ferroelectric layer, the extraction of a defect density by low-frequency noise analysis may be performed over a certain range from a position in the ferroelectric layer spaced apart from the channel by a certain distance.

As such, the extraction of a bulk defect density in the insulating layer may be performed by a low-frequency noise analysis method over a certain range from a certain position in the insulating layer, and an interface defect density in the first interface region may be extracted by, for example, a current-voltage measurement method.

Figure 12:
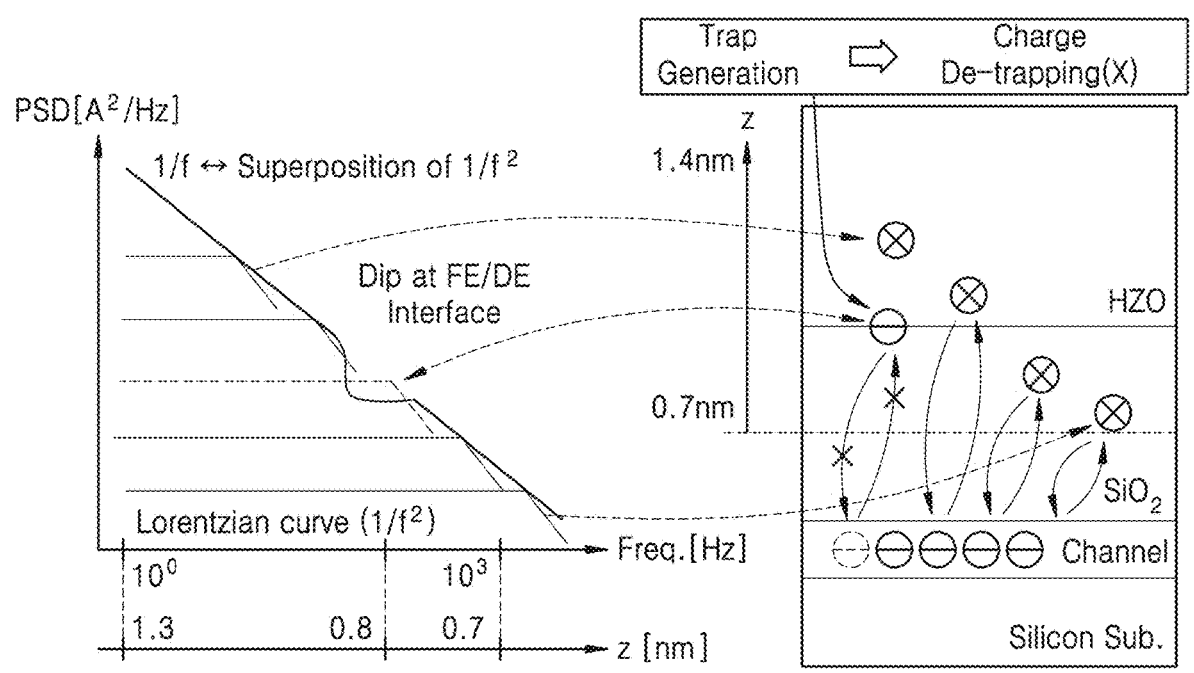
FIG. 12 illustrates a principle of extracting a defect density by low-frequency noise analysis with respect to a ferroelectric electronic device sample according to some example embodiments.
Figure 13:
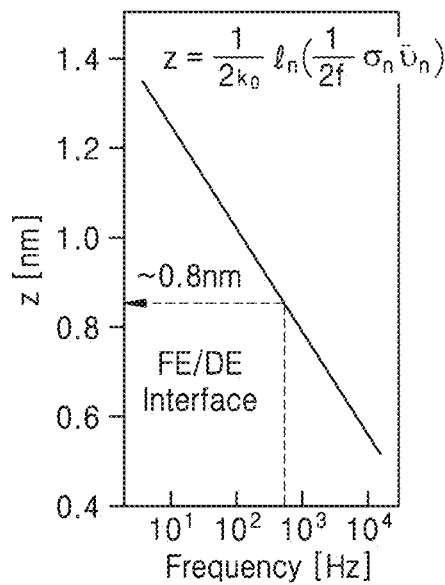
FIG. 13 is a graph illustrating a distance (z) from a channel determined according to a frequency based on a low-frequency noise analysis method with respect to the ferroelectric electronic device sample of FIG. 12.
Figure 14:
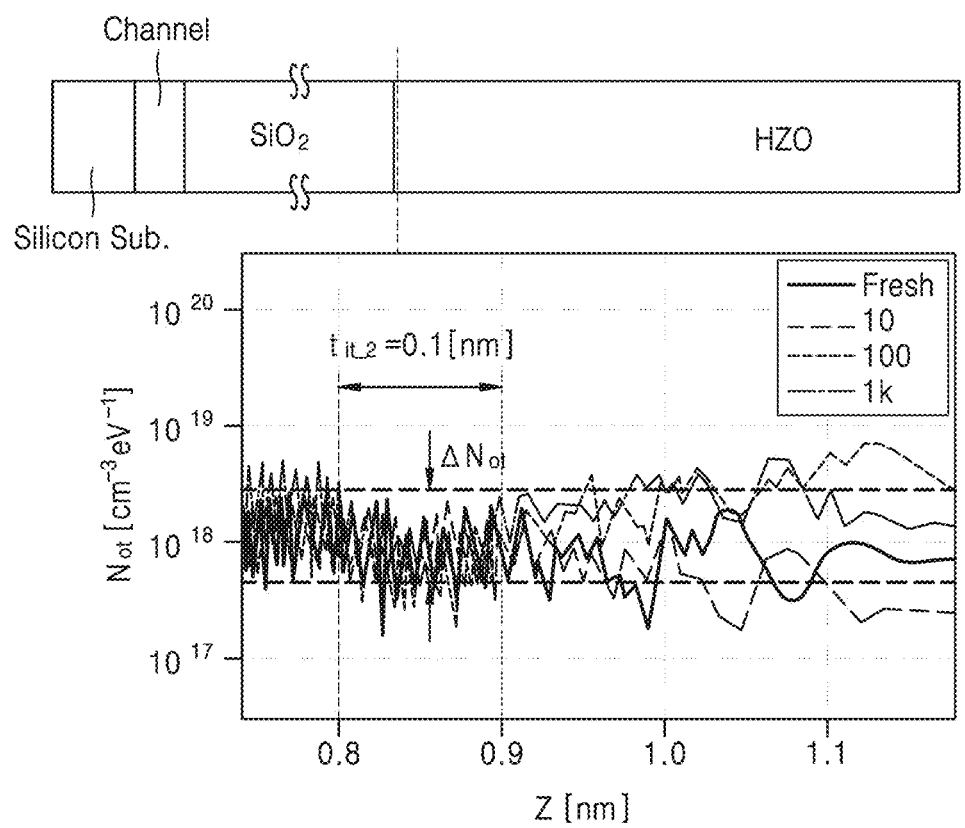
FIG. 14 illustrates a result of extracting a defect density in a gate insulating layer of a ferroelectric electronic device sample according to some example embodiments by applying the low-frequency noise analysis method of FIG. 12.

FIG. 12 illustrates a principle of extracting a bulk defect density by low-frequency noise analysis with respect to a ferroelectric electronic device sample according to some example embodiments. FIG. 12 illustrates a principle of extracting a defect density in a gate insulating layer by a low-frequency noise analysis method with respect to a ferroelectric electronic device sample including a channel over a silicon substrate (Silicon Sub.) and a paraelectric layer including SiO$_2$ and a ferroelectric layer including HZO as a gate insulating layer over the channel. FIG. 13 is a graph illustrating a distance (z) from a channel determined according to a frequency based on a low-frequency noise analysis method with respect to the ferroelectric electronic device sample of FIG. 12. FIG. 14 illustrates the result of extracting a defect density in a gate insulating layer of a ferroelectric electronic device sample according to some example embodiments by applying the low-frequency noise analysis method of FIG. 12.

Referring to FIG. 12, the amount of defects and/or the distance of the gate insulating layer in the vertical direction from the channel (z=0 nm) that are obtained by low-frequency noise measurement may be obtained from a power spectral density (PSD) plot that is inversely proportional to a frequency (Freq).

Based on the low-frequency noise analysis method, the distance from the channel may be determined by Equation 1 according to the frequency. The frequency may correspond to a signal component applied to the x axis in the equipment for low-frequency noise analysis.

$$z = \frac{1}{2\kappa_0}\ln\left(\frac{1}{2f}\sigma_n \bar{v} n\right) \quad \text{[Equation 1]}$$

Here, each of $\kappa_0$, $\sigma_n$, and v may be constants while f may be a frequency and z may be the distance from the channel.

Thus, the frequency may be converted into the distance (z) from the channel through Equation 1.

Based on the low-frequency noise analysis method, the horizontal axis of FIG. 12 represents the frequency versus the distance (z) from the corresponding channel, which may be obtained from the graph of FIG. 13 and Equation 1.

FIG. 13 illustrates the relationship between a frequency and a distance (z) from a channel determined by Equation 1 according to a frequency based on a low-frequency noise analysis method with respect to the ferroelectric electronic device sample according to some example embodiments illustrated at the right side of FIG. 12.

FIGS. 12 and 13 by example illustrate that a power spectral density (PSD) plot inversely proportional to the frequency (Freq or f) may be obtained in the range of about 0.5 nm to about 1.4 nm from the channel determined according to the frequency. Also, FIGS. 12 and 14 exemplarily illustrate that the interface (FE/DE interface or ferroelectric/dielectric interface or ferroelectric/paraelectric interface) of an HZO-ferroelectric layer/a SiO$_2$-paraelectric layer of the gate insulating layer, for example, the second interface, is located at a distance of about 0.8 nm, for example, in the range of about 0.8 nm to about 0.9 nm, from the channel. Here, the distance (z) from the channel from which the PSD plot may be obtained is not limited to the range of about 0.5 nm to about 1.4 nm, and the distance (z) may vary. Also, the distance from the interface (FE/DE interface) of a ferroelectric layer/a paraelectric layer of the gate insulating layer, for example, the second interface, from the channel is not limited to about 0.8 nm and may vary.

The PSD plot inversely proportional to the frequency (Freq) based on the low-frequency noise analysis method may be obtained by applying a constant voltage to the gate electrode and the drain of the ferroelectric electronic device according to some example embodiments and then measuring a source current by a dynamic signal analyzer.

A PSD value having a slope of 1/f may be a signal in which all of various defects in the gate insulating layer overlap each other and may have defect information, and the amount of defects ($N_{ot}$) may be extracted by using Equation 2.

$$N_{ot} = S_{VFB} \frac{fW_G L_G C_{ox}^2}{q^2 kT\lambda} \quad \text{[Equation 2]}$$

Herein, $S_{VFB}$ may correspond to a PSD plot value inversely proportional to the frequency of FIG. 12, a slope thereof may be changed by adjusting a gate voltage applied to the gate electrode, and a term $$\frac{W_G L_G C_{ox}^2}{q^2 kT\lambda}$$

may be a constant.

Thus, when a PSD plot inversely proportional to the frequency is obtained, a total amount of defects ($N_{ot}$) may be extracted by applying Equation 2.

As such, because the PSD plot inversely proportional to the frequency (Freq) may be obtained based on the low-frequency noise analysis method and the PSD value in this case may be converted into the amount of defects, the defect density in the gate insulating layer may be extracted by applying the low-frequency noise analysis method, and by normalizing by volume if appropriate.

FIG. 14 illustrates the result of extracting a defect density in a gate insulating layer of a ferroelectric electronic device sample according to some example embodiments by applying a low-frequency noise analysis method.

FIG. 14 illustrates the result of extracting a (volumetric) defect density in the gate insulating layer including a SiO$_2$-paraelectric layer and a HZO-ferroelectric layer with an initial state (Fresh) and the number of operations are performed 10 times, 100 times, 1 k times with respect to a sample of a ferroelectric electronic device according to some example embodiments, and it may be determined/confirmed that a defect density $N_{ot}$ has a value of $10^{19}$ cm$^{-3}$eV$^{-1}$ or less, even when the number of operations is repeated.

Figure 15:
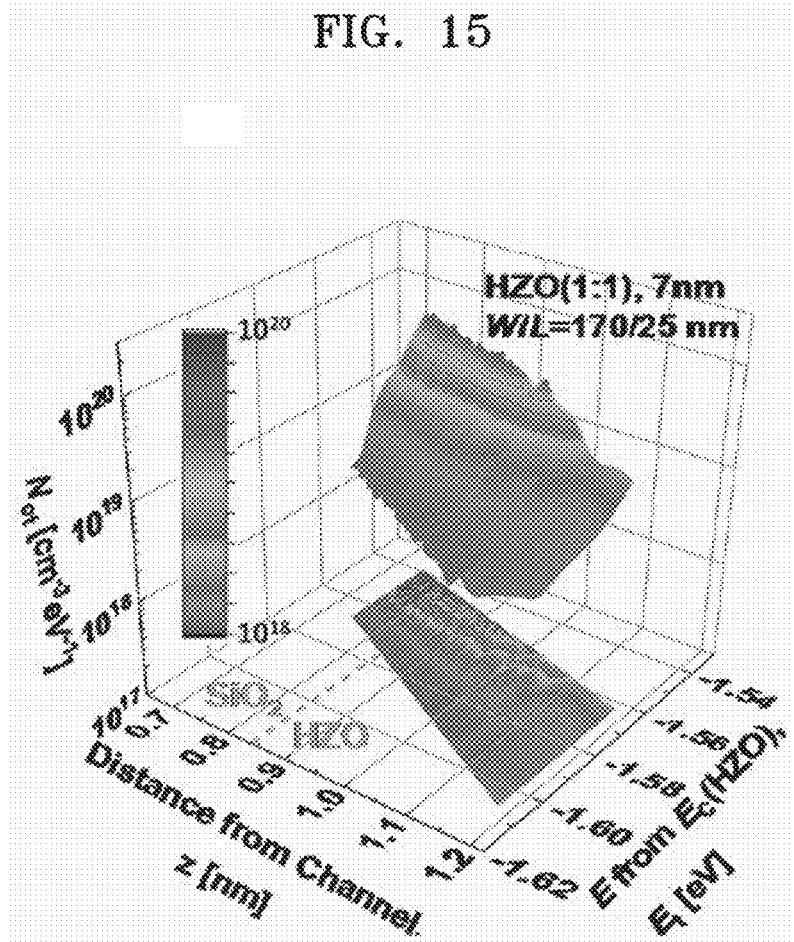
FIG. 15 illustrates a result of extracting trap density (defect density) according to space/energy with respect to a sample of a ferroelectric electronic device according to some example embodiments, by applying a low-frequency noise analysis method.

Moreover, FIG. 15 illustrates the result of extracting a trap density (a defect density) depending on space/energy with respect to a sample of a ferroelectric electronic device according to some example embodiments by applying a low-frequency noise analysis method. FIG. 15 illustrates a trap density depending on space/energy with respect to a ferroelectric electronic device sample according to some example embodiments in which a paraelectric layer includes SiO$_2$, a ferroelectric layer includes HZO including Hr and Zr in a 1:1 content and has a layer thickness of about 7 nm, and W(width)/L(length)=170/25 nm. In FIG. 15, $E_c$ represents the conduction band energy of the HZO-ferroelectric layer.

Referring to FIG. 15, it may be determined/confirmed that the ferroelectric electronic device sample according to some example embodiments has a bulk trap density in the range of about $10^{17}$ cm$^{-3}$eV$^{-1}$ to about $10^{20}$ cm$^{-3}$eV$^{-1}$ even when the trap density depending on space/energy is extracted.

As such, it may be determined/confirmed that the bulk defect density in the gate insulating layer in the ferroelectric electronic device according to some example embodiments has a value within the range of about $10^{17}$ cm$^{-3}$eV$^{-1}$ to about $10^{20}$ cm$^{-3}$eV$^{-1}$ when the low-frequency noise analysis method is applied.

Alternatively or additionally, because the trap density depending on space/energy with respect to the ferroelectric electronic device according to some example embodiments may be extracted by applying the low-frequency noise analysis method, a defect of the gate insulating layer may be effectively analyzed by extracting the space and/or energy distribution even when the ferroelectric electronic device according to some example embodiments is formed in, for example, a 3D channel structure such as a GAA channel, a nanosheet channel, or a fin channel.

Figure 16A:
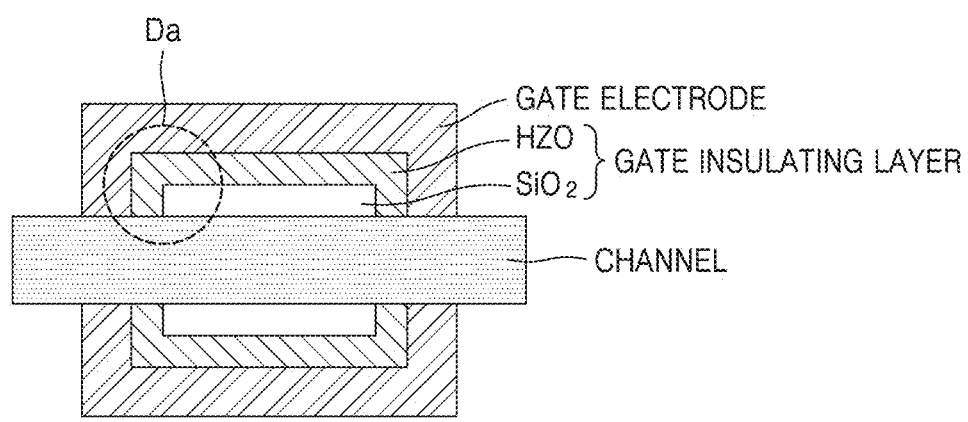
FIG. 16A schematically illustrates a 3D nanosheet channel structure of a ferroelectric electronic device according to some example embodiments.
Figure 16B:
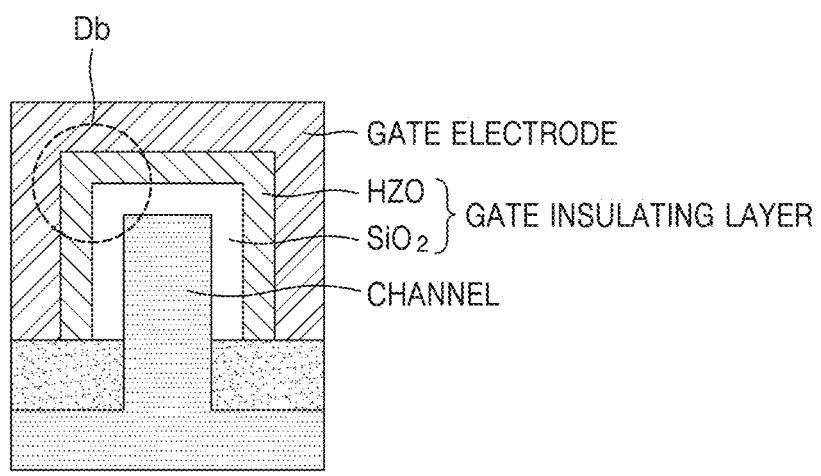
FIG. 16B schematically illustrates a 3D fin channel structure of a ferroelectric electronic device according to some example embodiments.

For example, as illustrated in FIGS. 16A and 16B, when there is a 3D channel structure such as a nanosheet channel or a fin channel, and where device reduction or miniaturization is achieved, when a repeated device operation occurs such as a repeated cycling occurs, a defect may be concentrated and greatly increased in an edge area Da or Db of the gate insulating layer. FIG. 16A schematically illustrates a 3D nanosheet channel structure of a ferroelectric electronic device according to some example embodiments, and FIG. 16B schematically illustrates a 3D fin channel structure of a ferroelectric electronic device according to some example embodiments. As illustrated in FIGS. 16A and 16B, a defect may be greatly concentrated in the edge area Da or Db.

When the ferroelectric electronic device according to some example embodiments is formed in a 3D channel structure such as a GAA channel, a nanosheet channel, or a fin channel, even when a defect is concentrated in an edge area of the 3D channel structure, when a repeated device operation occurs, the defect of the gate insulating layer of the ferroelectric electronic device according to some example embodiments may be effectively analyzed by extracting the space and energy distribution by applying the low-frequency noise analysis method.

Moreover, referring back to FIG. 12, a dip in the PSD plot may appear at the ferroelectric layer/paraelectric layer interface (FE/DE interface). At this interface, the PSD plot may appear in the form of a Lorentzian curve that is inversely proportional to 1/f$^2$. Moreover, referring to FIG. 14, it may be seen that the defect count/density $N_{ot}$ at this interface region is smaller than in other regions. For example, when a trap occurs at the interface of ferroelectric layer/paraelectric layer, this may show that there may exist charges maintaining a trapped state without being de-trapped again and this may show that the trap density, that is, the defect density, at the interface may be different from that in the bulk region.

As illustrated by example in FIGS. 12 and 14, the interface (FE/DE interface) of the ferroelectric layer/paraelectric layer of the gate insulating layer, for example, the second interface, may be located at a distance of about 0.8 nm, for example, in the range of about 0.8 nm to about 0.9 nm, from the channel, and the defect density at the second interface may be quantitatively obtained, for example, by integrating the defect density $N_{ot}$ obtained by the low-frequency noise analysis method. For example, because the second interface is located in the range of about 0.8 nm to about 0.9 nm, the defect density (trap density) information of the ferroelectric layer/paraelectric layer interface (HZO/SiO$_2$ interface) may be quantitatively obtained, for example, by obtaining an average value ($\Delta N_{ot}$) by integrating the $N_{ot}$ value in the region range including the second interface ($t_{it\_2}$=0.1 nm).

FIG. 17 illustrates a principle of extracting an interface defect density at a Si channel interface of a ferroelectric electronic device according to some example embodiments by using a current-voltage measurement method. FIG. 17 illustrates the result of measuring a trap density (defect density) $D_{it\_1}$ at the interface of a Si channel in an initial state (fresh state) by the current-voltage measurement method with respect to a ferroelectric electronic device sample according to some example embodiments in which a ferroelectric layer includes HZO including Hr and Zr in a 1:1 content and has a layer thickness of about 7 nm and W/L=170/500 nm.

Referring to FIG. 17, it may be seen that the defect density ($D_{it\_1}$) at the interface of the Si channel in the ferroelectric electronic device sample according to some example embodiments has a value of $10^{10}$ cm$^{-2}$eV$^{-1}$ or more, for example, about $10^{12}$ cm$^{-2}$eV$^{-1}$ to about $10^{13}$ cm$^{-2}$eV$^{-1}$. As such, the defect density at the interface of the ferroelectric electronic device according to some example embodiments may be extracted by the current-voltage measurement method.

Figure 18:
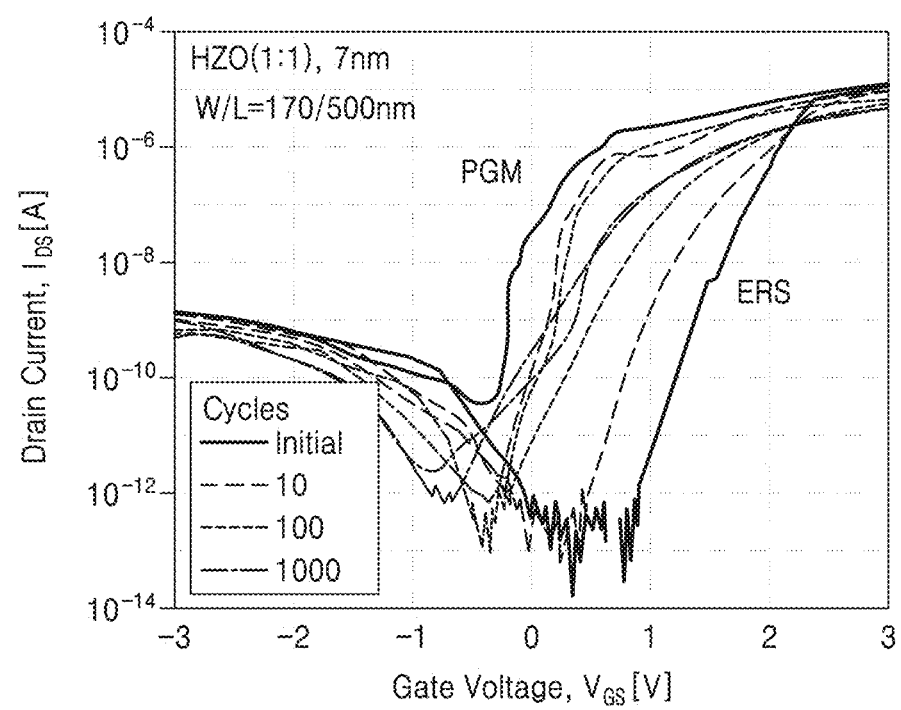
FIG. 18 is a graph illustrating a current-voltage change according to the number of operations of program (PGM) and erase (ERS) modes of a ferroelectric electronic device according to some example embodiments.

FIG. 18 is a graph illustrating a current-voltage change depending on the number of operations of program (PGM) and erase (ERS) modes or operations of a ferroelectric electronic device according to some example embodiments. FIG. 18 illustrates a current-voltage change depending on the number of operations in the program (PGM) and erase (ERS) modes with respect to a sample in which a ferroelectric layer includes HZO including Hr and Zr in a 1:1 content and has a layer thickness of about 7 nm, W/L=170/500 nm, and the sample has a stack structure of a SiO$_2$ paraelectric layer, a HZO ferroelectric layer, and a metal layer (a gate electrode) over a Si channel (a silicon substrate). In FIG. 18, the horizontal axis represents a gate voltage applied through the gate electrode, and the vertical axis represents a drain current ($I_{DS}$).

As may be seen from FIG. 18, even when the number of operations increases as an initial state, 10 times, 100 times, and 1,000 times, a program/erase operation of the ferroelectric electronic device according to some example embodiments may be normally performed.

Figure 19A:
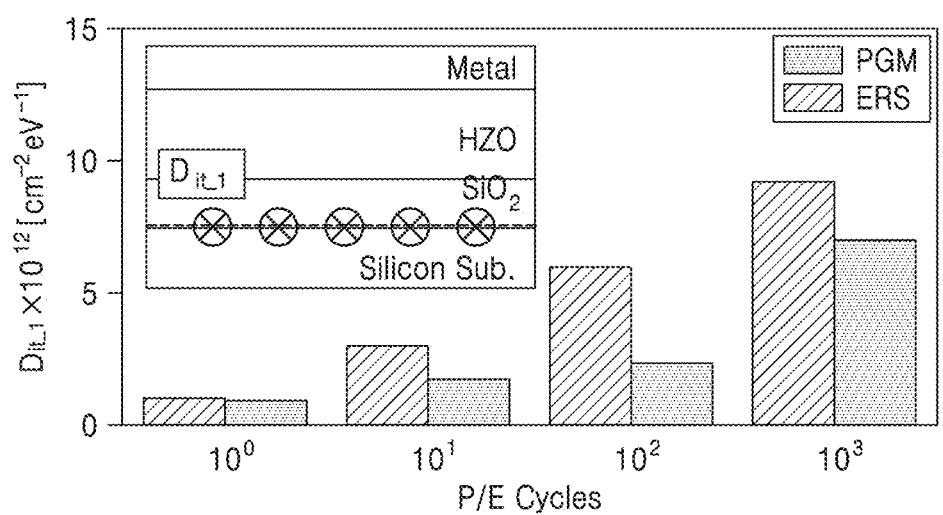
FIGS. 19A and 19B illustrate a defect density ($D_{it\_1}$) at a Si channel interface and a bulk defect density ($N_{ot}$) in a gate insulating layer according to the number of operations in program (PGM) and erase (ERS) modes, which are obtained with respect to a ferroelectric electronic device sample according to the embodiment of FIG. 18.
Figure 19B:
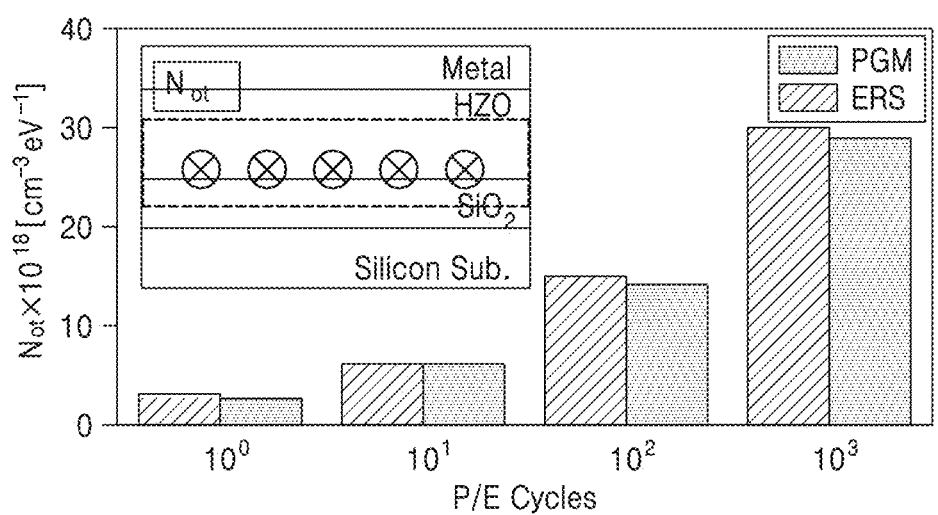

FIGS. 19A and 19B illustrate a defect density ($D_{it\_1}$) at a Si channel interface and a bulk defect density ($N_{ot}$) in a gate insulating layer depending on the number of operations in program (PGM) and erase (ERS) modes, which are obtained with respect to a ferroelectric electronic device sample according to various example embodiments described in FIG. 18. In FIGS. 19A and 19B, the horizontal axis represents the number of program (PGM)/erase (ERS) operations (P/E cycles).

Referring to FIG. 19A, the defect density ($D_{it\_1}$) at the Si channel interface may be extracted by the current-voltage measurement method, and in this case, as the number of program/erase operations (P/E cycles) increases as 1 time, 10 times, 100 times, and 1,000 times, the amount of defects ($\Delta D_{it\_1}$) may increase but the interface defect density may exhibit a value within the range of about $10^{10}$ cm$^{-2}$eV$^{-1}$ to about $10^{13}$ cm$^{-2}$eV$^{-1}$.

Referring to FIG. 19B, the defect density in the gate insulating layer may be extracted by low-frequency noise analysis, and in this case, as the number of program/erase operations (P/E cycles) increases as 1 time, 10 times, 100 times, and 1,000 times, the amount of defects ($N_{ot}$) in the gate insulating layers may increase but the bulk defect density may exhibit a value within the range of about $10^{17}$ cm$^{-3}$eV$^{-1}$ to about $10^{20}$ cm$^{-3}$eV$^{-1}$.

Moreover, as may be seen from FIGS. 19A and 19B, the amount of each defect may be distinguished in a program (PGM) state and an erase (ERS) state. Thus, although the polarity and/or number of charges affecting the gate insulating layer may be different, when the defect density extraction method according to some example embodiments is applied, the defect density may be analyzed separately according to the program (PGM) state and the erase (ERS) state.

The result of extracting the defect density with respect to the ferroelectric electronic device sample according to some embodiments by applying the defect density extraction method according to some example embodiments has been described above; however, this is merely illustrative, embodiments are not limited thereto, and the defect density extracting method according to some example embodiments may be applied to various ferroelectric electronic devices.

Moreover, in the ferroelectric electronic device according to some example embodiments, the insulating layer may have a bulk defect density of $10^{16}$ cm$^{-3}$eV$^{-1}$ or more, for example, about $10^{17}$ cm$^{-3}$eV$^{-1}$ to about $10^{20}$ cm$^{-3}$eV$^{-1}$, and an interface defect density of $10^{10}$ cm$^{-2}$eV$^{-1}$ or more, for example, about $10^{10}$ cm$^{-2}$eV$^{-1}$ to about $10^{13}$ cm$^{-2}$ eV$^{-1}$ or about $10^{11}$ cm$^2$ eV$^1$ to about $10^{14}$ cm$^{-2}$eV$^{-1}$, and the stack structure and the material composition and thickness of each layer may be variously modified. Also, the defect density of various ferroelectric electronic devices may be determined by applying the defect density extracting method according to some example embodiments.

Figure 20:
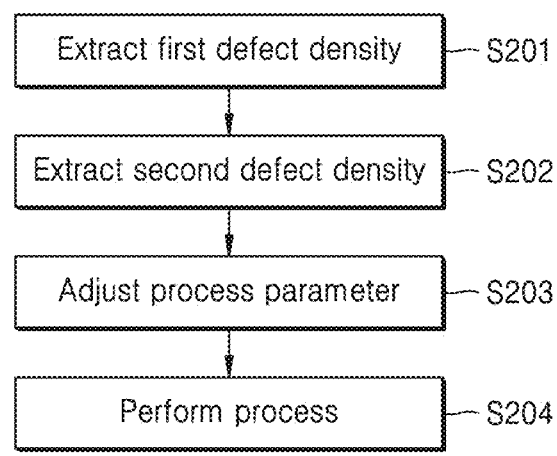
FIG. 20 illustrates a method of fabricating a ferroelectric device, according to some example embodiments.

FIG. 20 illustrates a method of fabricating a ferroelectric device according to some example embodiments.

Referring to FIG. 20, a first defect density, e.g. a bulk defect density, may be extracted (S201).

For example the bulk defect density may be extracted of an insulating layer may be extracted by using a low-frequency noise technique.

Additionally a second defect density may be extracted (S202).

For example, the interface defect density may be extracted. For example the interface defect density may or may not be extracted with a current-voltage method.

Furthermore a process parameter may be adjusted (S202). The process parameter may be a parameter used in a process to fabricate a ferroelectric device. The process parameter may be adjusted based on the first and/or second defect density.

Still further the process may be performed on a ferroelectric device, based on the adjusted process parameter (S203).

According to the ferroelectric electronic device according to some example embodiments, because the insulating layer has a bulk defect density of $10^{16}$ cm$^{-3}$eV$^{-1}$ or more and an interface defect density of $10^{10}$ cm$^{-2}$eV$^{-1}$ or more, ferroelectric properties suitable for implementing a logic device and/or a memory device may be achieved.

Also, according to the ferroelectric electronic device according to some example embodiments, because a defect in the interface and the insulating layer may be more accurately identified and fed back to the process, it may be possible to contribute to manufacturing a ferroelectric electronic device having further improved ferroelectric properties.

It should be understood that various example embodiments described herein should be considered in a descriptive sense only and not for purposes of limitation. Descriptions of features or aspects within each of the various example embodiments should typically be considered as available for other similar features or aspects in other of the variously described example embodiments. While one or more embodiments have been described with reference to the figures, it will be understood by those of ordinary skill in the art that various changes in form and details may be made therein without departing from the spirit and scope as defined by the following claims.

What is claimed is:

1. A ferroelectric electronic device comprising:
   a first layer;
   an insulating layer including a first interface and a ferroelectric layer, the first interface adjacent to the first layer, the insulating layer further including a paraelectric layer corresponding to the first interface with the first layer, the paraelectric layer between the first layer and the ferroelectric layer; and
   an upper electrode over the insulating layer,
   wherein the insulating layer has a bulk defect density per volume of $10^{16}$ cm$^{-3}$eV$^{-1}$ or more and an interface defect density per area of $10^{10}$ cm$^{-2}$eV$^{-1}$ or more, and
   wherein the paraelectric layer includes at least one of SiO, AlO, SiON, SiN, a native oxide of Ge, or a native oxide of Si.

2. The ferroelectric electronic device of claim 1, wherein the first interface has an interface defect density per area of about $10^{10}$ cm$^{-2}$eV$^{-1}$ to about $10^{13}$ cm$^{-2}$eV$^{-1}$, and the ferroelectric layer has a bulk defect density per volume of about $10^{17}$ cm$^{-3}$eV$^{-1}$ to about $10^{20}$ cm$^{-3}$eV$^{-1}$.

3. The ferroelectric electronic device of claim 1, wherein
   a second interface between the paraelectric layer and the ferroelectric layer has a second interface defect density per area of about $10^{11}$ cm$^{-2}$eV$_{-1}$ to about $10^{14}$ cm$^{-3}$eV$^{-1}$, and
   the paraelectric layer has the bulk defect density per volume of about $10^{17}$ cm$^{-3}$eV$^{-1}$ to about $10^{20}$ cm$^{-3}$eV$^{-1}$.

4. The ferroelectric electronic device of claim 3, wherein the paraelectric layer includes at least one of SiO, AlO, SiON, and SiN.

5. The ferroelectric electronic device of claim 1, wherein the ferroelectric layer includes an oxide including at least one of Hf and Zr.

6. The ferroelectric electronic device of claim 5, wherein the ferroelectric layer includes at least one type of dopant among Si, Al, Y, La, Gd, Sr, C, Ge, Sn, Pb, Mg, Ca, Ba, and Ti.

7. The ferroelectric electronic device of claim 1, wherein the first layer includes a channel,
   the insulating layer corresponds to a gate insulating layer, and
   the upper electrode corresponds to a gate electrode.

8. The ferroelectric electronic device of claim 7, wherein the ferroelectric electronic device includes a memory device having two or more threshold voltages.

9. The ferroelectric electronic device of claim 7, wherein the ferroelectric electronic device has negative capacitance.

10. The ferroelectric electronic device of claim 7, wherein the channel includes any one of a gate-all-around channel, a nanosheet channel, and a fin channel.

11. The ferroelectric electronic device of claim 7, wherein the channel includes at least one of Si, Ge, an oxide semiconductor, a group III-V semiconductor, a two-dimensional (2D) material, quantum dots, and an organic material.

12. The ferroelectric electronic device of claim 1, wherein the first layer includes a lower electrode.

13. The ferroelectric electronic device of claim 3, where the second interface is adjacent to the paraelectric layer.

14. The ferroelectric electronic device of claim 3, wherein the second interface is an interface between the paraelectric layer and the ferroelectric layer.

15. The ferroelectric electronic device of claim 14, wherein the first interface is an interface between the paraelectric layer and the first layer.

16. The ferroelectric electronic device of claim 1, wherein the first layer includes Si or GE and the paraelectric layer includes the native oxide of the respective Si or GE.

17. The ferroelectric electronic device of claim 12, wherein the lower electrode includes at least one of aluminum (Al), tungsten (W), molybdenum (Mo), titanium (Ti), tantalum (Ta), chromium (Cr), and copper (Cu), or any alloy thereof.

* * * * *